(12) United States Patent
Hobbs et al.

(10) Patent No.: US 11,163,341 B1
(45) Date of Patent: Nov. 2, 2021

(54) COMPUTING DEVICE SUPPORT SURFACE MOUNTING SYSTEM

(71) Applicant: Dell Products L.P., Round Rock, TX (US)

(72) Inventors: Derric Christopher Hobbs, Round Rock, TX (US); Tzu-Wei Tai, Taipei (TW); Raymond Chao Long Chou, New Taipei (TW); Brandon Chu, North District (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/946,639

(22) Filed: Jun. 30, 2020

(51) Int. Cl.
| | | |
|---|---|---|
| *G06F 1/18* | (2006.01) | |
| *F16M 13/02* | (2006.01) | |
| *H05K 5/02* | (2006.01) | |
| *F16B 1/00* | (2006.01) | |

(52) U.S. Cl.
CPC .............. *G06F 1/183* (2013.01); *F16B 1/0071* (2013.01); *F16M 13/02* (2013.01); *G06F 1/181* (2013.01); *H05K 5/0217* (2013.01)

(58) Field of Classification Search
None
See application file for complete search history.

(56) References Cited

U.S. PATENT DOCUMENTS

| | | | | |
|---|---|---|---|---|
| 6,560,094 | B2 * | 5/2003 | Schmidt ................. | A47B 81/06 248/917 |
| 7,317,613 | B2 * | 1/2008 | Quijano ............... | F16M 11/041 16/323 |
| 7,478,889 | B2 * | 1/2009 | Marroquin .............. | G06F 1/181 312/223.1 |
| 8,083,193 | B2 * | 12/2011 | Matsui ................. | F16M 11/041 248/221.11 |
| 8,120,904 | B2 * | 2/2012 | Morrison .................. | G06F 1/16 361/679.58 |
| 8,199,498 | B2 * | 6/2012 | Wang .................... | G06F 1/1656 361/679.59 |
| 8,300,406 | B2 * | 10/2012 | Chen ....................... | G06F 1/166 361/679.55 |
| 8,531,829 | B2 * | 9/2013 | Oberpriller ............. | G06F 1/181 361/679.41 |
| 8,567,737 | B2 * | 10/2013 | Chen .................... | H04B 1/3877 248/316.2 |

(Continued)

*Primary Examiner* — Xanthia C Cunningham
(74) *Attorney, Agent, or Firm* — Joseph Mencher

(57) ABSTRACT

A device mounting system includes a device bracket coupled to a device, and a support surface mount coupled to the device bracket. The support surface mount includes a base member mounted to a support surface, a securing member extending from the base member, and a securing latch that is included in the securing member and that moves between a secured orientation in which it engages the device bracket to secure the device bracket to the support surface mount, and an unsecured orientation that allows the device bracket to be decoupled from the support surface mount. A release member in the securing member may be actuated to move the securing latch between the secured and unsecured orientations. A locking element in the securing member may be actuated to prevent movement of the securing latch from the secured to the unsecured orientation to lock the device bracket to the support surface mount.

20 Claims, 30 Drawing Sheets

(56) References Cited

U.S. PATENT DOCUMENTS

| | | | |
|---|---|---|---|
| 9,713,272 B2* | 7/2017 | Kim | H01L 51/5237 |
| 9,955,598 B1* | 4/2018 | Wen | F16M 11/041 |
| 2003/0160460 A1* | 8/2003 | Crisp | G06F 1/181 |
| | | | 292/83 |
| 2007/0046837 A1* | 3/2007 | Elberbaum | F16M 13/02 |
| | | | 348/739 |
| 2008/0253081 A1* | 10/2008 | Tracy | G06F 1/1616 |
| | | | 361/679.5 |
| 2010/0101854 A1* | 4/2010 | Wallaert | F24F 11/00 |
| | | | 174/502 |
| 2010/0149752 A1* | 6/2010 | Lian | G06F 1/166 |
| | | | 361/679.59 |
| 2010/0176266 A1* | 7/2010 | Minkley | F16M 13/02 |
| | | | 248/476 |
| 2011/0310534 A1* | 12/2011 | Cosley | H02B 1/32 |
| | | | 361/632 |
| 2013/0277520 A1 | 10/2013 | Funk et al. | |
| 2015/0264823 A1* | 9/2015 | Shirley | F16M 13/02 |
| | | | 248/287.1 |
| 2016/0241007 A1* | 8/2016 | Tremaine | H01R 9/2416 |
| 2017/0064842 A1* | 3/2017 | Dernier | H05K 5/0013 |
| 2017/0209318 A1* | 7/2017 | Schroeder | B64C 1/20 |

* cited by examiner

COMPUTING DEVICE SUPPORT SURFACE MOUNTING SYSTEM

BACKGROUND

The present disclosure relates generally to information handling systems, and more particularly to mounting information handling systems to support surfaces.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is sometimes desirable to mount information handling systems such as, for example, desktop computing systems, to support surfaces. For example, desktop computing systems included in the OPTIPLEX® family of computing systems available from DELL® Inc. of Round Rock, Tex., United States, are provided with a compute module that may be mounted to a display stand that also supports a display that is coupled to the compute module, with the display stand securing the compute module such that it may not be removed from the display stand, as well as providing for the routing of cables connected to the compute module. However, the compute module discussed above is provided by a "stand-alone", ElectroMagnetic Interference (EMI) certified computing device, which allows users to purchase the compute module for use without the display stand discussed above in order to, for example, reduce costs associated with the desktop computing system. Such uses of the compute module discussed (i.e., without the display stand) leaves the compute module unsecured and the cables connected to it unmanaged, and the relatively small size of the compute module often results in the unintentional movement of the compute module away from its desired location, which can cause cabling connected to that compute module to become disconnected.

Accordingly, it would be desirable to provide computing device support surface mounting system that addresses the issues discussed above.

SUMMARY

According to one embodiment, an Information Handling System (IHS) includes a compute module including: a processing system; and a member system that is coupled to the processing system and that includes instructions that, when executed by the processing system, cause the processing system to perform at least one computing operation; a compute module bracket that is configured to couple to the compute module; and a support surface mount that is configured to couple to the compute module bracket, wherein the support surface mount includes: a base member that is configured to mount to a support surface; a securing member that extends from the base member; a securing latch that is included in the securing member and that is configured to be provided in: a secured orientation in which the securing latch engages the compute module bracket when the compute module bracket is coupled to the support surface mount in order to secure the compute module bracket to the support surface mount; and an unsecured orientation that allows the compute module bracket to be decoupled from the support surface mount when the compute module bracket is coupled to the support surface mount; a release member that is configured to move the securing latch between the secured orientation and the unsecured orientation; and a locking element that is included in the securing member and that is configured to be actuated to prevent movement of the securing latch from the secured orientation to the unsecured orientation in order to lock the compute module bracket to the support surface mount.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
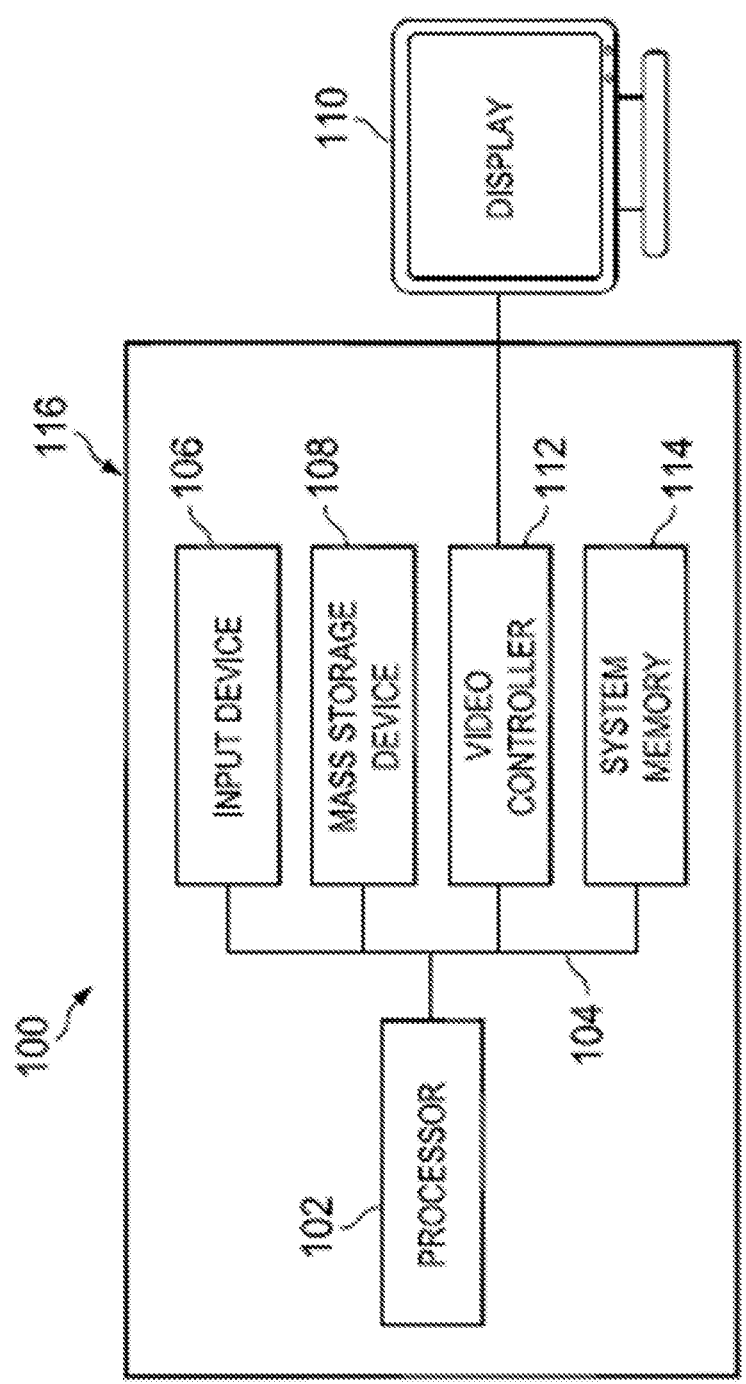
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
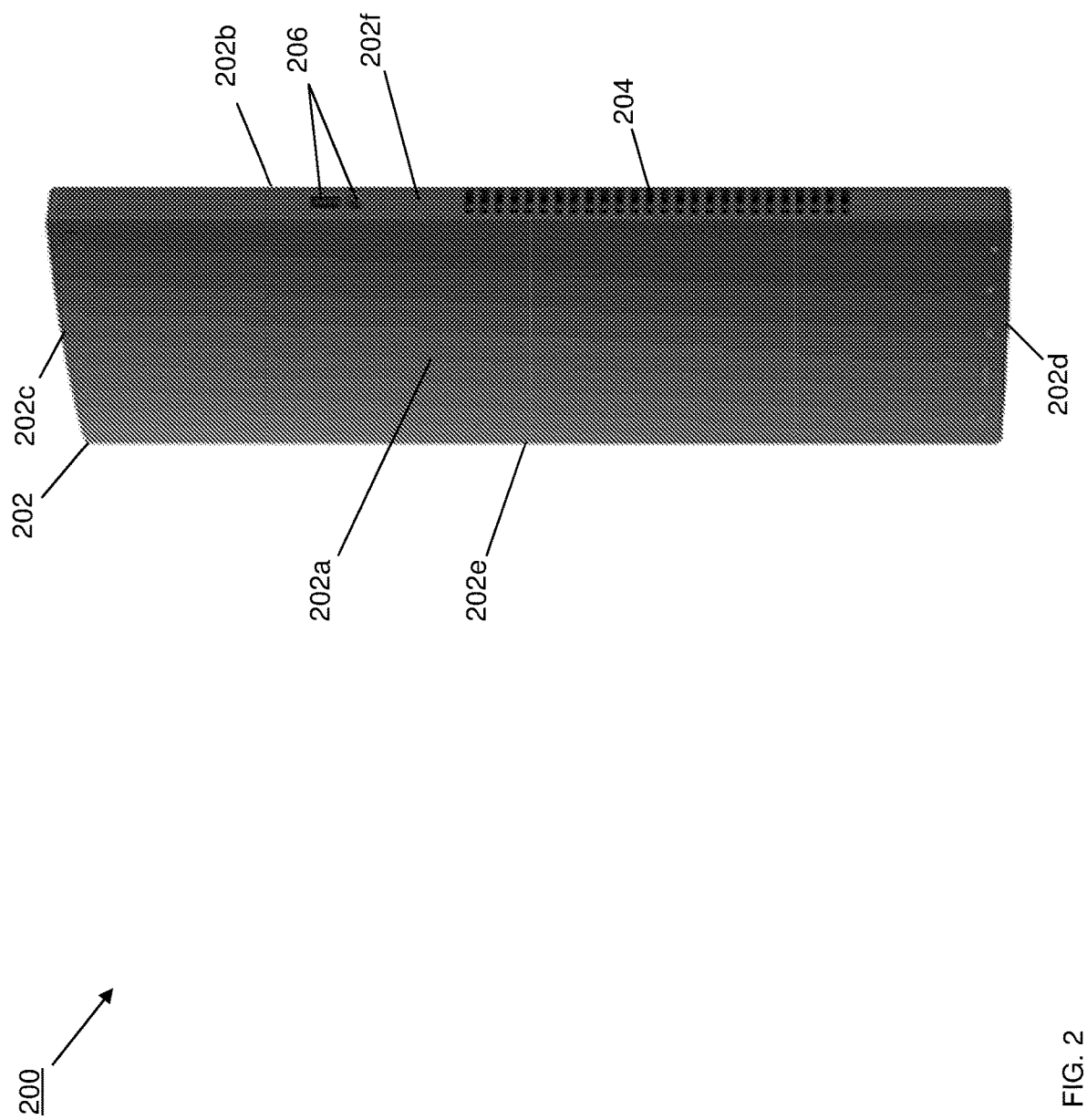
FIG. 2 is a perspective view illustrating an embodiment of a compute module.

Referring now to FIG. 2, an embodiment of a computing device that may be utilized in the computing device support surface mounting system of the present disclosure is illustrated as being provided by a compute module 200, although one of skill in the art in possession of the present disclosure will appreciate that the compute module 200 may be replaced by a variety of computing devices while remaining within the scope of the present disclosure as well. In an embodiment, the compute module 200 may be provided by the IHS 100 discussed above with reference to FIG. 1 and/or may include some or all of the components of the IHS 100. Furthermore, while illustrated and discussed as being provided by a computing device, one of skill in the art in possession of the present disclosure will recognize that the functionality of the computing device support surface mounting system of the present disclosure may be utilized with other types of devices that are configured to operate similarly as the compute module 200 discussed below.

In the illustrated embodiment, the compute module 200 includes a chassis 202 that houses the components of the compute module 200, only some of which are discussed below. The chassis 202 includes a front surface 202a, a rear surface 202b that is located opposite the chassis 202 from the front surface 202a, a top edge 202c that extends between the front surface 202a and the rear surface 202b, a bottom edge 202d that is located opposite the chassis 202 form the top edge 202c and that extends between the front surface 202a and the rear surface 202b, and a pair of side edges 202e and 202f that are located opposite the chassis 202 from each other and that extend between the front surface 202a, the rear surface 202b, the top edge 202c, and the bottom edge 202d. While not illustrated herein, one of skill in the art in possession of the present disclosure will recognize that the chassis 202 may define a chassis housing between the front surface 202a, the rear surface 202b, the top edge 202c, the bottom edge 202d, and the side edges 202e and 202f, and that chassis housing may house the components of the compute module 200. Furthermore, FIG. 2 illustrates how the chassis 200 defines airflow apertures 204 and cabling connectors 206 that extend into the side edge 202f of the chassis 202, and one of skill in the art in possession of the present disclosure will appreciate how similar airflow apertures and/or cabling connectors may be defined by the chassis 202 in other locations (e.g., the bottom edge 202d discussed below, as well as any of the top edge 202c, the side edge 202e, the front surface 202a, and the rear surface 202b as well.)

As such, one of skill in the art in possession of the present disclosure will recognize how the chassis housing defined by the chassis 202 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to perform a variety of computing operations known in the art. Similarly, the chassis housing defined by the chassis 202 may also house a storage system (not illustrated, but which may include the storage 108 discussed above with reference to FIG. 1) that is coupled to the processing system, a communication system that is coupled to the processing system and that may be provided by a Network Interface Controller (NIC), wireless communication systems (e.g., BLUETOOTH®, Near Field Communication (NFC) components, WiFi components, etc.), and/or any other communication components, as well as any other computing device components that would be apparent to one of skill in the art in possession of the present disclosure.

However, while a specific compute module 200 has been illustrated, one of skill in the art in possession of the present disclosure will recognize that devices operating according to the teachings of the present disclosure in a manner similar to that described below for the compute module 200 may include a variety of components and/or component configurations while remaining within the scope of the present disclosure as well. For example, in some embodiments discussed below, the compute module 200 may be configured to connect to an "expansion" component (e.g., a Solid State Drive (SSD)) adjacent the rear surface 202b of the chassis 202 such that at least a portion of that component extends from the rear surface 202b of the chassis 202.

Figure 3:
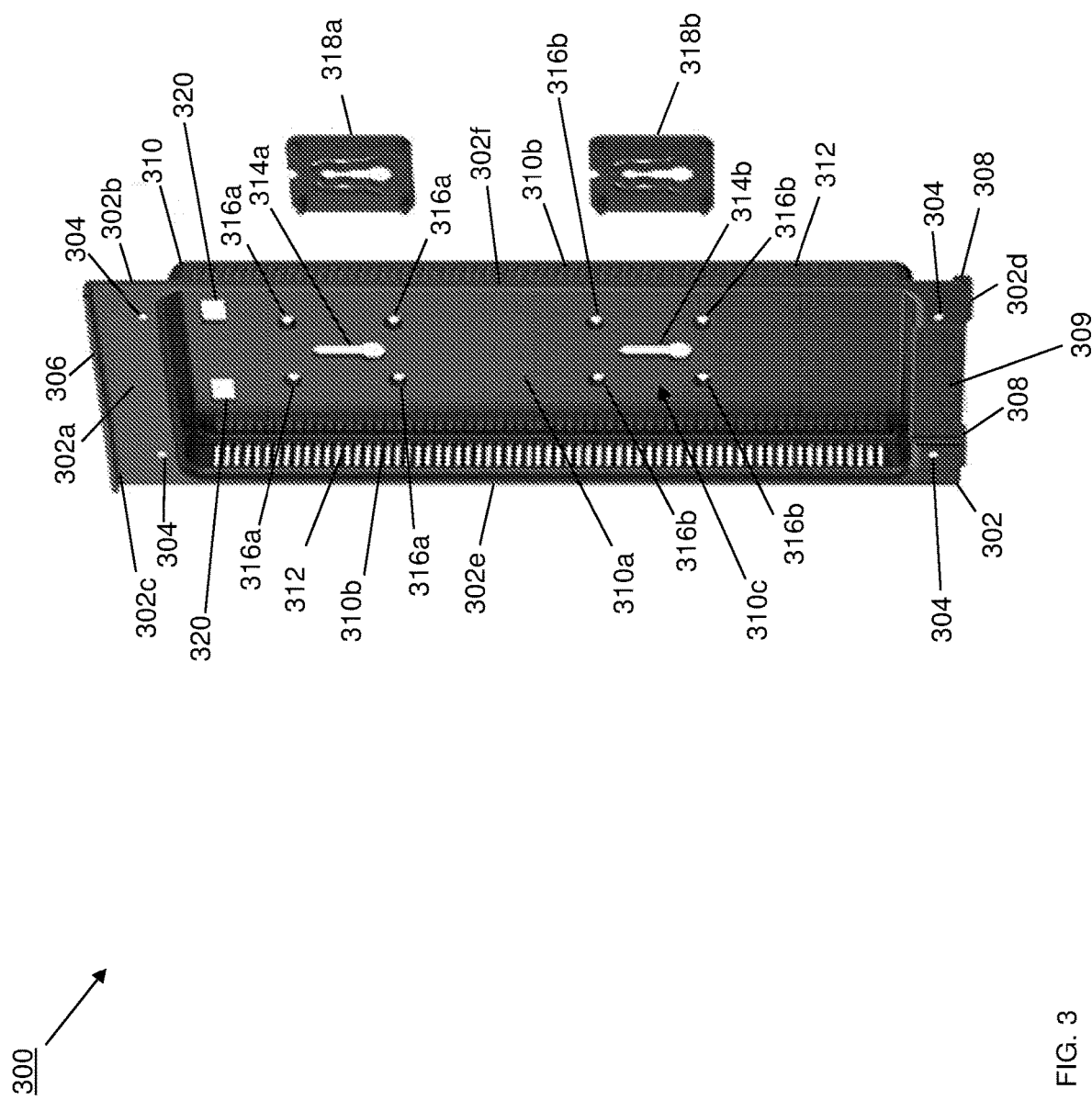
FIG. 3 is a perspective view illustrating an embodiment of a compute module bracket used with the compute module of FIG. 2.

Referring now to FIG. 3, an embodiment of a device bracket 300 is illustrated that is utilized in the computing device support surface mounting system of the present disclosure. In the illustrated embodiment, the device bracket 300 includes a base 302 having a front surface 302a, a rear surface 302b that is located opposite the base 302 from the front surface 302a, a top edge 302c that extends between the front surface 302a and the rear surface 302b, a bottom edge 302d that is located opposite the chassis 302 form the top edge 302c and that extends between the front surface 302a and the rear surface 302b, and a pair of side edges 302e and 302f that are located opposite the chassis 302 from each other and that extend between the front surface 302a, the rear surface 302b, the top edge 302c, and the bottom edge 302d. In the illustrated embodiment, a plurality of compute module mounting apertures 304 are defined by the base 302 and extend through the base 302 from the front surface 302a to the rear surface 302b in a spaced apart orientation such that the compute module mounting apertures 304 are located adjacent respective corners of the base 302. Furthermore, a securing lip 306 extends from the top edge 302c of the base 302 in a substantially perpendicular orientation relative to the base 302. Further still, a pair of wall mount coupling members 308 extend from the bottom edge 302d of the base 302 on either side of a connector/plug clearance feature 309 that is defined by the base 302.

In the illustrated embodiment, a device bracket housing member 310 extends from the rear surface 302b of the base 302 and includes a primary wall 310a that is coupled to the base 302 by a plurality of side walls 310b, with the primary wall 310a and the side walls 310b of the device bracket housing member 310 defining a device bracket housing 310c between them. In the illustrated embodiment, a plurality of airflow apertures 312 are defined by the side walls 310b on the device bracket housing member 310 and extend through the side walls 310b to the device bracket housing 310c. Furthermore, the device bracket housing member 310 defines a pair of first support surface mounting elements that are illustrated and described below as first wall mounting apertures 314a and 314b that are defined by the primary wall 310a, and that one of skill in the art in possession of the present disclosure will recognize operate to allow mounting elements such as screws that are connected to a support wall to move the through the wall mounting apertures 314a and 314b and secure the primary wall 310a on the device bracket housing member 310 to a wall support surface. However, while the device bracket 300 is discussed below as being mounted to a wall support surface, one of skill in the art in possession of the present disclosure will appreciate that the device bracket 300 may be mounted to a variety of support surfaces (e.g., a display stand, a display, under a desk, etc.) while remaining within the scope of the present disclosure as well.

In the illustrated embodiment, the primary wall 310a of the device bracket housing member 310 also defines respective mounting feedback mechanism coupling apertures 316a and 316b adjacent the respective wall mounting apertures 314a and 314b and, as illustrated and discussed further below, a mounting feedback mechanism 318a may be provided on the primary wall 310a of the device bracket housing member 310 adjacent the wall mounting aperture 314a by coupling (e.g., heat staking) the mounting feedback mechanism 318a to the mounting feedback mechanism coupling apertures 316a. Similarly, a mounting feedback mechanism 318b may be provided on the primary wall 310a of the device bracket housing member 310 adjacent the wall mounting aperture 314b by coupling (e.g., heat staking) the mounting feedback mechanism 318b to the mounting feedback mechanism coupling apertures 316b as well. Finally, in the illustrated embodiment, the primary wall 310a of the device bracket housing member 310 also defines a pair of wall mount coupling apertures 320 that are located opposite the device bracket 300 from the pair of wall mount coupling members 308. However, while a specific device bracket 300 has been illustrated and described, one of skill in the art in possession of the present disclosure will recognize that the device bracket of the present disclosure may include a variety of components and component configurations while remaining within the scope of the present disclosure as well.

Figure 4A:
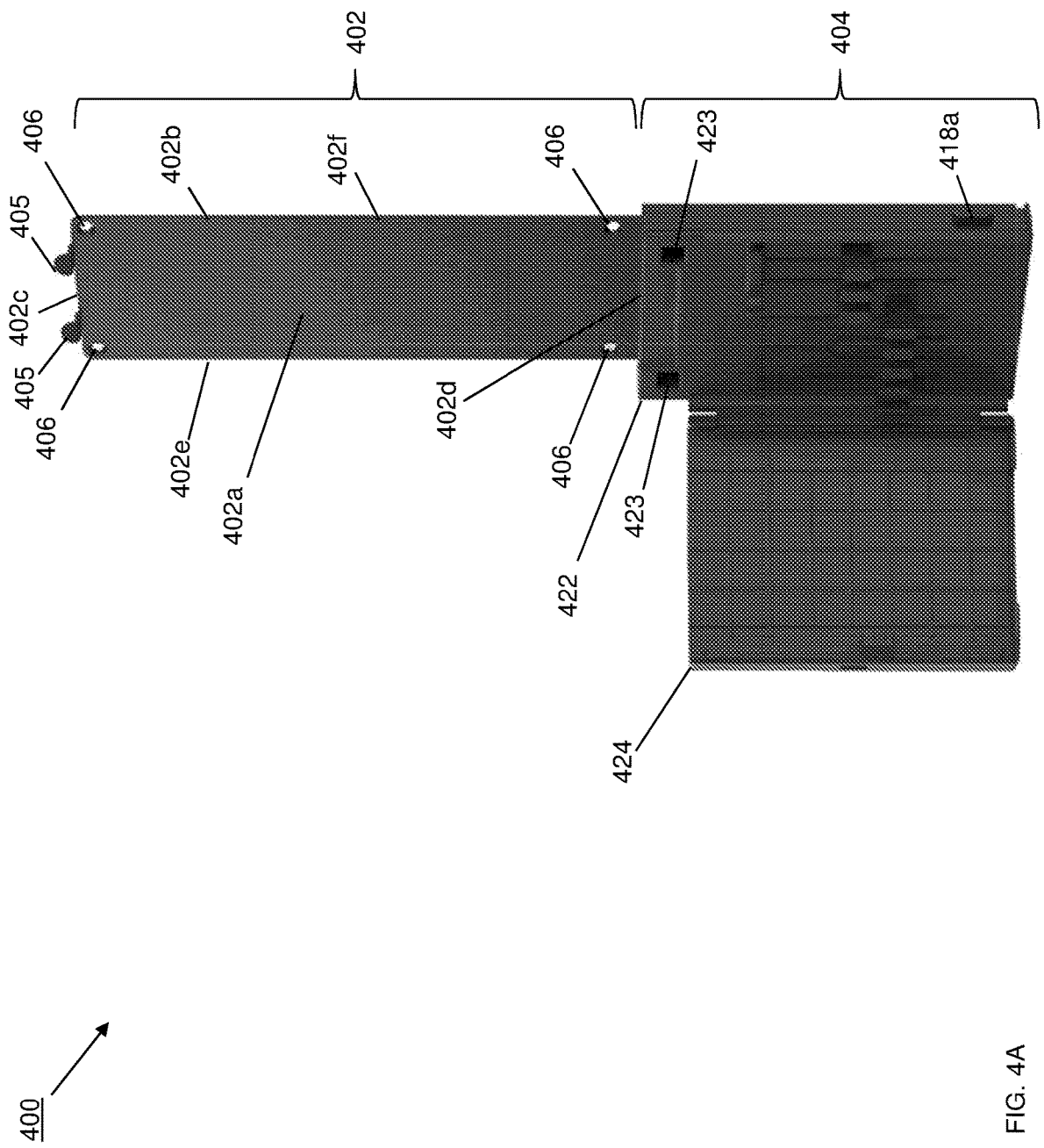
FIG. 4A is a perspective view illustrating an embodiment of a wall mount used with the compute module of FIG. 2 and the compute module bracket of FIG. 3.
Figure 4B:
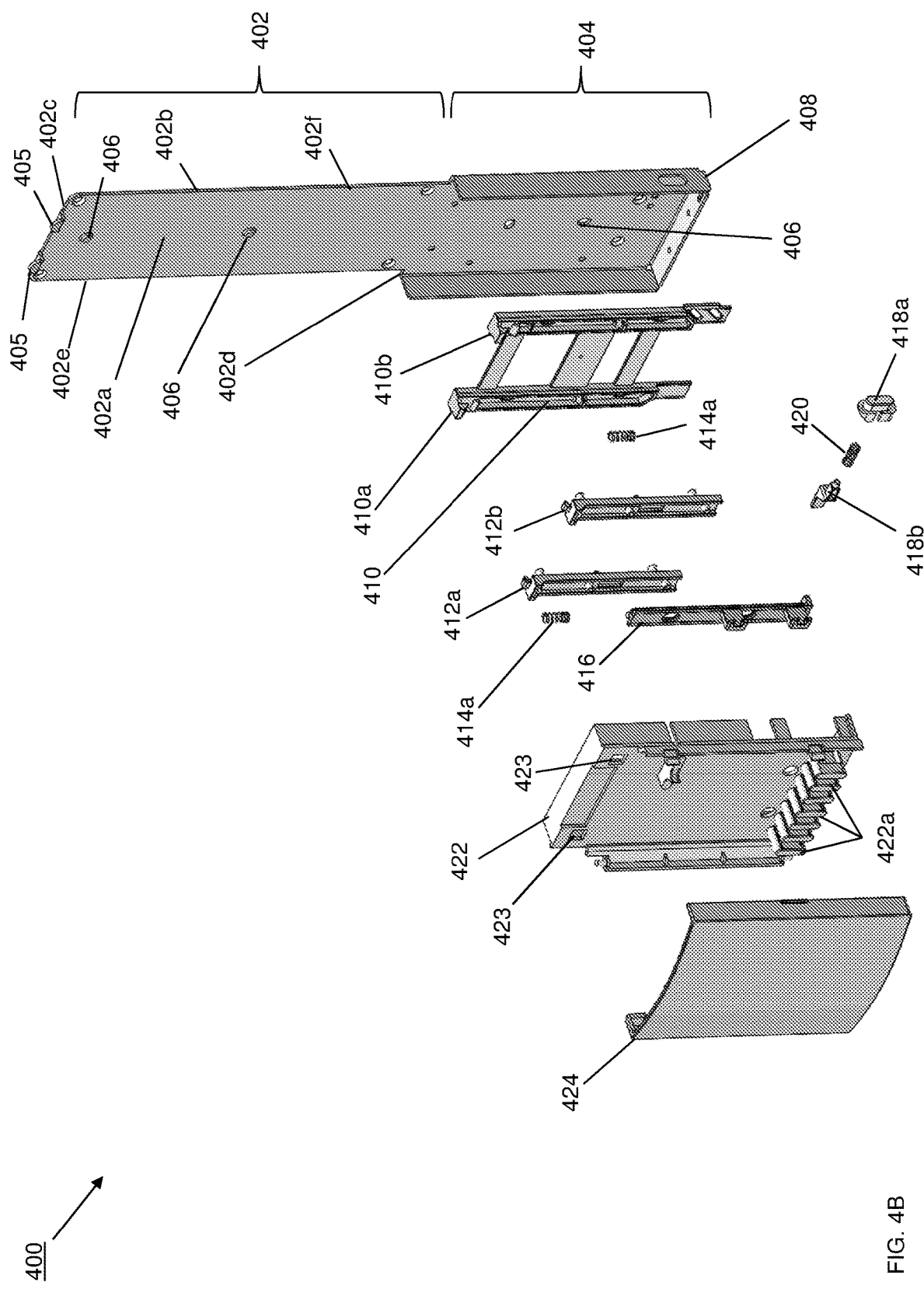
FIG. 4B is an exploded perspective view illustrating an embodiment of the wall mount of FIG. 4A.
Figure 4C:
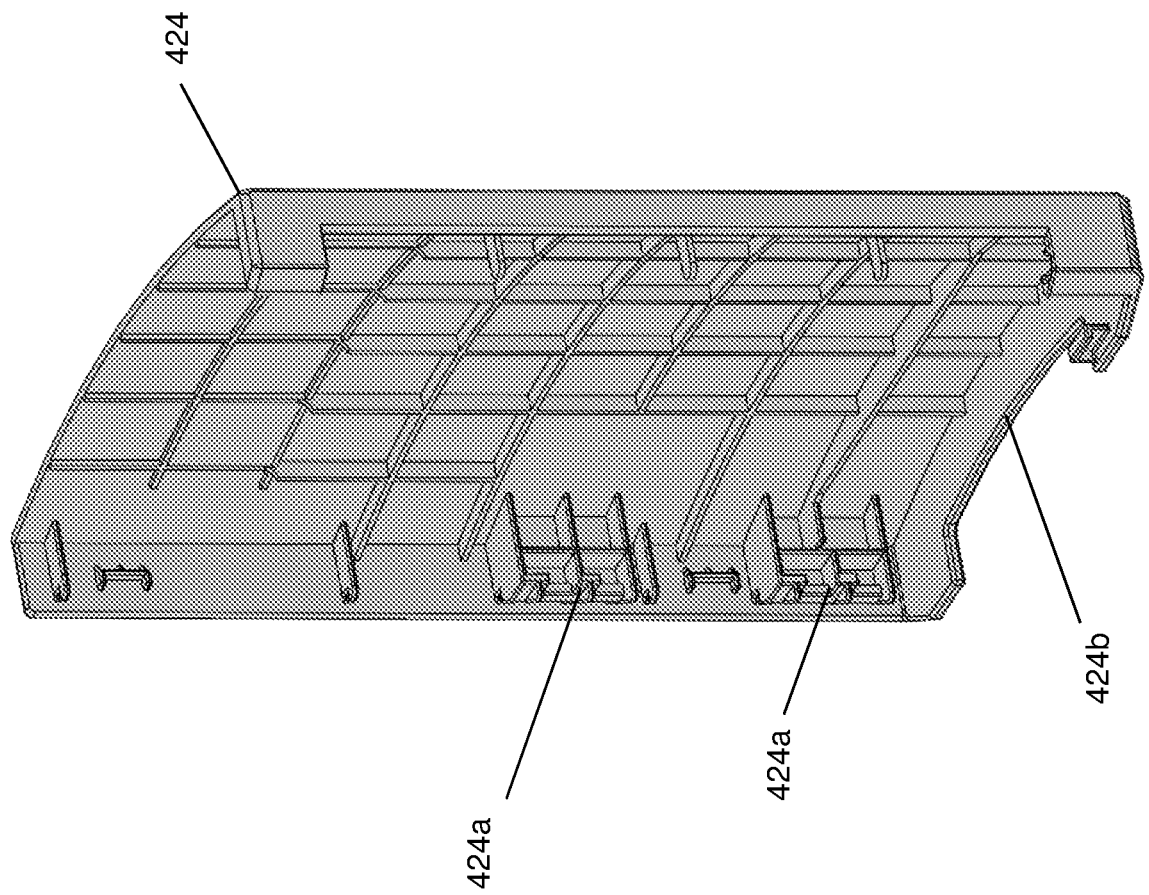
FIG. 4C is a rear perspective view illustrating an embodiment of a cable door on the wall mount of FIGS. 4A and 4B.

Referring now to FIGS. 4A, 4B, and 4C, an embodiment of a support surface mount is illustrated that is provided in the examples below by a wall mount 400 that is utilized in the computing device support surface mounting system of the present disclosure. In the illustrated embodiment, the wall mount 400 includes a base member 402 and a securing member 404 that extends from the base member 402. The base member 402 includes a front surface 402a, a rear surface 402b that is located opposite the base member 402 from the front surface 402a, a top edge 402c that extends between the front surface 402a and the rear surface 402b, a bottom edge 402d that is located opposite the base member 402 from the top edge 402c and that extends between the front surface 402a and the rear surface 402b, and a pair of side edges 402e and 402f that are located opposite the base member 402 from each other and that extend between the front surface 402a, the rear surface 402b, the top edge 402c, and the bottom edge 402d. As illustrated in both FIGS. 4A and 4B, the base member 402 may define a plurality of support surface mounting apertures that are described herein as wall mounting apertures 406 that extend through the base member 402 from the front surface 402a to the rear surface 402b, with FIG. 4A illustrating the wall mounting apertures 406 in a rectangular orientation adjacent respective corners of the base member 402, and FIG. 4B illustrating the wall mounting apertures 406 in a linear orientation and centrally located on the base member 402. A pair of device bracket mounting elements 405 extend from the base member 402 along the top edge 402c. However, while the wall mount 400 is discussed below as being mounted to a wall support surface, one of skill in the art in possession of the present disclosure will appreciate that the support surface mount of the present disclosure may be mounted to a variety of support surfaces (e.g., a display stand, a display, under a desk, etc.) while remaining within the scope of the present disclosure as well.

As illustrated in the embodiment of FIG. 4B, the securing member 404 on the wall mount 400 includes a securing member base 408 that extends from the base member 402 and that defines a wall mounting aperture 406 that is the linear configuration with the wall mounting apertures 406 defined by the base member 402. A securing latch member 410 includes a pair of securing latches 410a and 410b and is housed in the securing member base 408 such that the securing latch member 410 is movable relative to the securing member base 408. A pair of locking element coupling features 412a and 412b are coupled to the securing latch member 410, and a pair of respective biasing members 414a and 414b (provided in FIG. 4B by springs) are provided on the locking element coupling features 412a/412b to bias the securing latch member 410 in a securing orientation, discussed in further detail below. A locking element 416 is coupled to the locking element coupling feature 412b, and a release subsystem provided by a release member 418a and a securing latch member connection element 418b is located adjacent the securing latch member 410, with the release subsystem biased by a biasing element 420 (e.g., a spring) away from the securing latch member 410. The configuration and operation of the securing member 404 on the wall mount 400 in providing securing and locking functionality is described in further detail below.

In the illustrated embodiment, the securing member 404 on the wall mount 400 also include a cable routing base 422 having a plurality of cable routing elements 422a that define cable routing channels between them, and the routing of cables using the cable routing base 422 is discussed in further detail below. As illustrated and discussed in further detail below, the cable routing base 422 may include other features for routing, securing, and/or otherwise managing cables as well. Furthermore, the cable routing base 422 also defines a pair of device bracket coupling apertures 423 that, as discussed below, operate with the bracket mounting elements 405 on the base member 402 to connect to the device bracket 300 of FIG. 3. As will be appreciated by one of skill in the art in possession of the present disclosure, the cable routing base 422 may couple to the securing member base 408 to house the securing latch member 410, the locking element coupling features 412a and 412b, the locking element 416, a portion of the release subsystem, and/or any other securing and locking features utilized in the securing member 404. A securing door 424 is movably coupled to the cable routing base 422 and, as illustrated in FIG. 4C, includes a pair of locking features 424a that, as discussed in further detail below, may be engaged by the locking element 416 to prevent the securing door 424 from opening in order to prevent access to the cabling routed using the cable routing base 422, and a cabling aperture 424b that may allow cabling to be routed out of the securing member 404 on the wall mount 400. However, while a specific wall mount 400 has been illustrated and described, one of skill in the art in possession of the present disclosure will recognize that the support surface mount of the present disclosure may include a variety of components and component configurations while remaining within the scope of the present disclosure as well.

Figure 5:
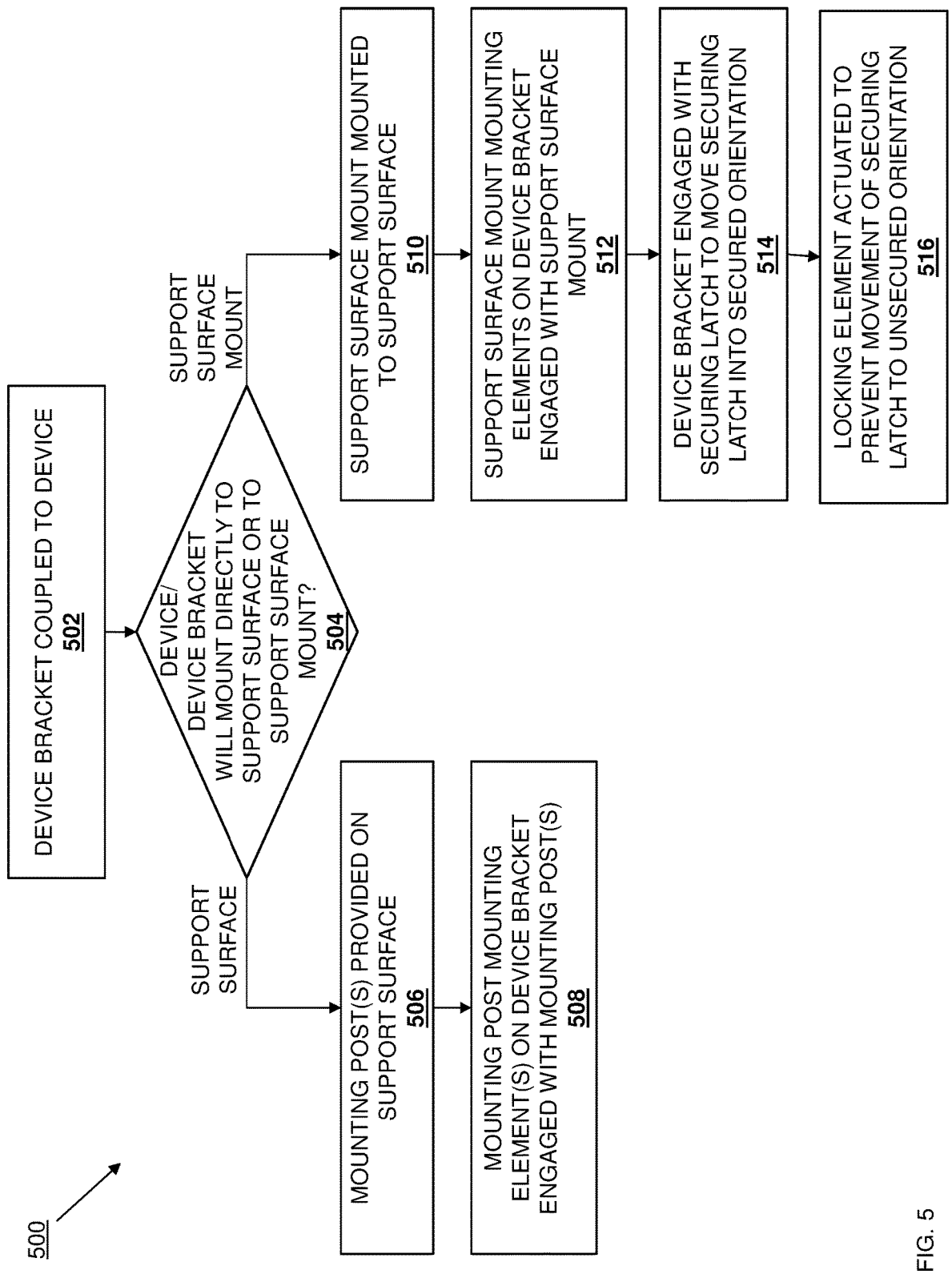
FIG. 5 is a flow chart illustrating an embodiment of a method for mounting a computing device.

Referring now to FIG. 5, an embodiment of a method 500 for mounting a computing device is illustrated. As discussed below, embodiments of the systems and methods of the present disclosure provide a "two-in-one" support surface mounting system that enables a relatively low-cost support surface mounting solution for devices, as well as a relatively higher cost and more secure support surface mounting solution those devices. For example, the device support surface mounting system includes a device bracket that couples to a device. For the relatively low-cost support surface mounting solution, at least one second support surface mounting element on the device bracket may be engaged with at least one mounting post on a support surface to mount the device bracket directly to the support surface. For the relatively higher cost and more secure support surface mounting solution, a support surface mount is provided that includes a base member mounts to the support surface, and a securing member that extends from the base member. A securing latch is included in the securing member and may be provided in a secured orientation in which the securing latch engages the device bracket when the device bracket is coupled to the support surface mount in order to secure the device bracket to the support surface mount, and an unsecured orientation that allows the device bracket to be decoupled from the support surface mount when the device bracket is coupled to the support surface mount. A release member is included in the securing member and moves the securing latch between the secured orientation and the unsecured orientation. A locking element is included in the securing member and may be actuated to prevent movement of the securing latch from the secured orientation to the unsecured orientation in order to lock the device bracket to the support surface mount. As such, mounting solutions are provided for devices that enable the securing of those devices when desired.

Figure 6A:
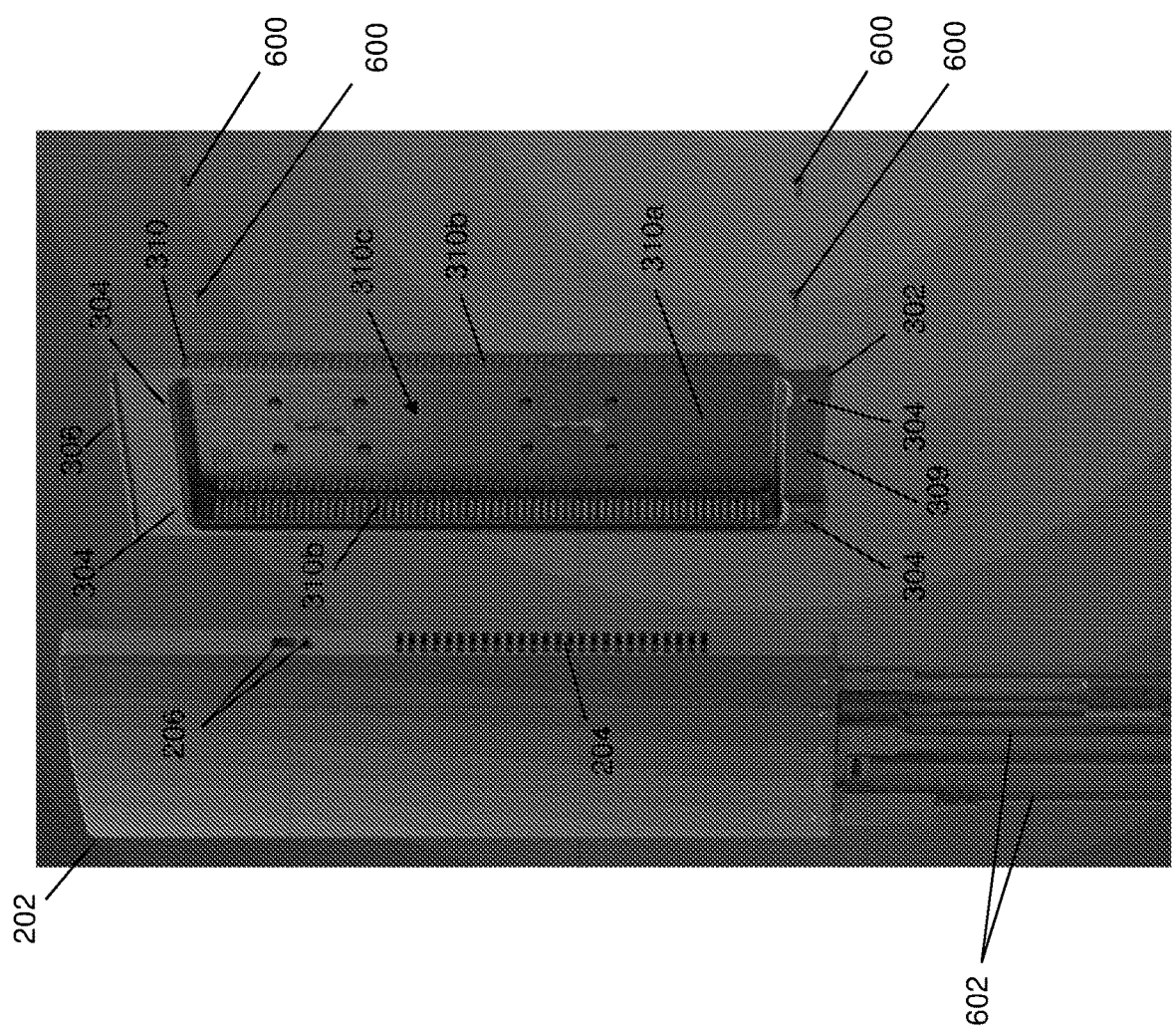
FIG. 6A is a perspective view illustrating an embodiment of the compute module bracket of FIG. 3 being coupled to the compute module of FIG. 2.
Figure 6B:
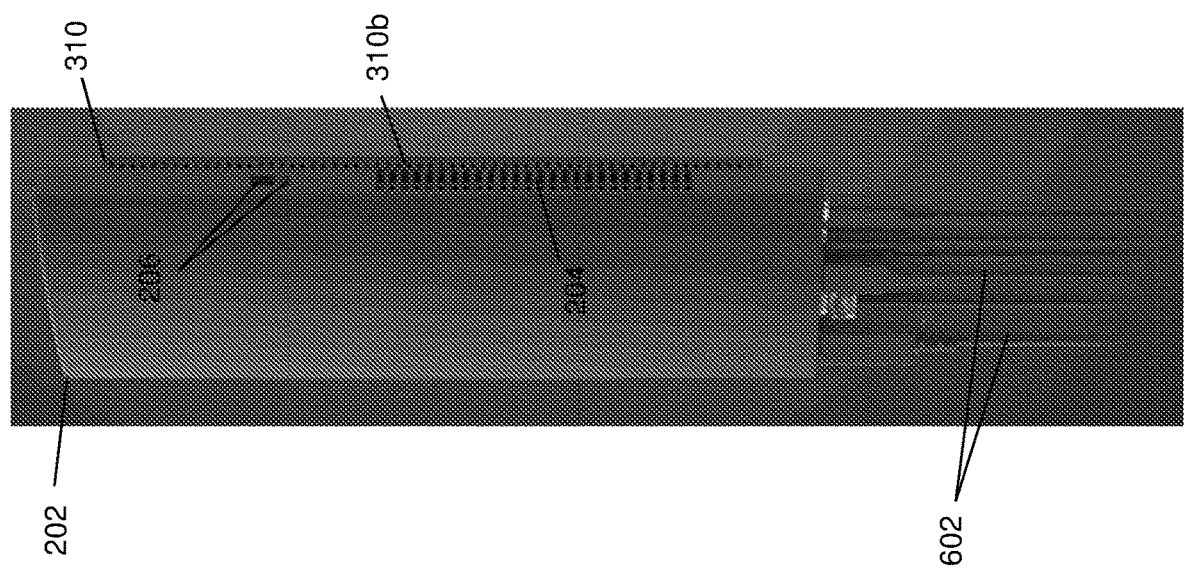
FIG. 6B is a front perspective view illustrating an embodiment of the compute module bracket of FIG. 3 coupled to the compute module of FIG. 2.
Figure 6C:
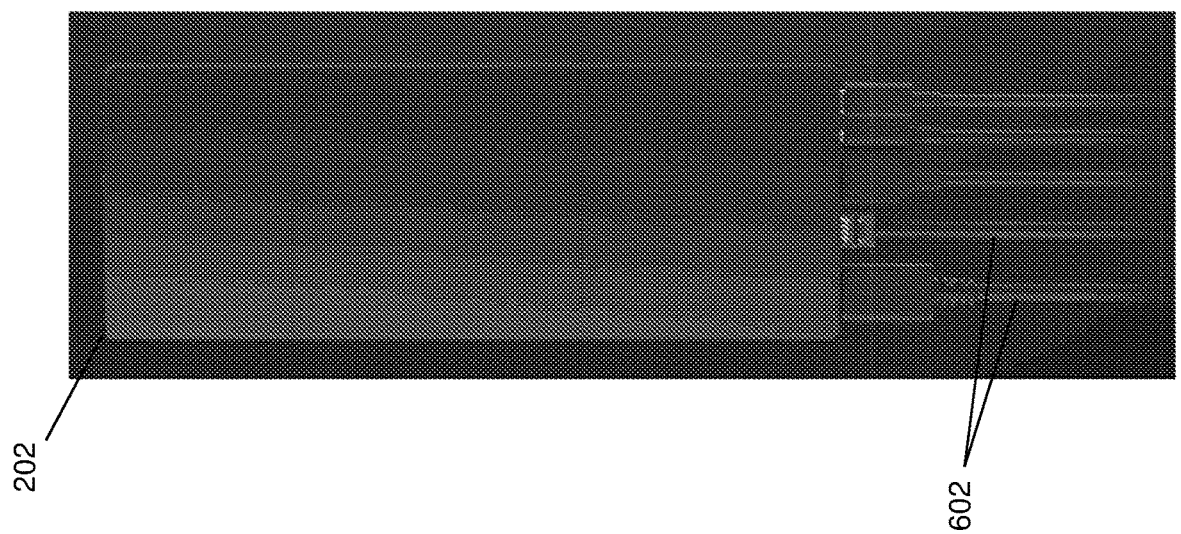
FIG. 6C is a front view illustrating an embodiment of the compute module bracket of FIG. 3 coupled to the compute module of FIG. 2.
Figure 6D:
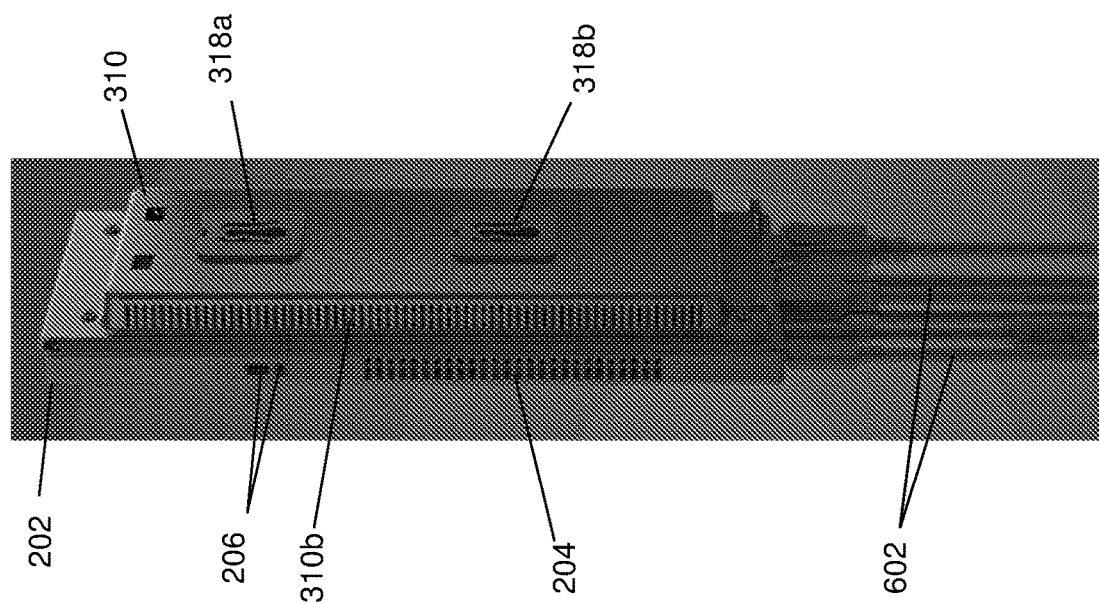
FIG. 6D is a rear perspective view illustrating an embodiment of the compute module bracket of FIG. 3 coupled to the compute module of FIG. 2.

The method 500 begins at block 502 where a device bracket is coupled to a device. In an embodiment, at block 502, the device bracket 300 discussed above with reference to FIG. 3 is coupled to the compute module 200 discussed above with reference to FIG. 2. With reference to FIGS. 6A, 6B, 6C, and 6D, the device bracket 300 may be positioned adjacent the compute module 200 such that the device bracket housing 310c is located adjacent the rear surface 202c of the compute module 200, as illustrated in FIG. 6A. FIG. 6A also illustrates how a plurality of coupling elements 600 (e.g., screws in the illustrated example) may engage the compute module coupling apertures 304 on the device bracket 300 and corresponding coupling apertures (not visible) on the rear surface 202c of the compute module 200 in order to mount the device bracket 300 to the compute module 200, with the securing lip 306 on the device bracket 300 engaging the top edge 202c of the compute module in order to secure the compute module 200 in the device bracket 300 (e.g., by preventing access to computing module components via a top cover on the compute module 200), as illustrated in FIGS. 6B-6D. Furthermore, FIGS. 6A-6D illustrate how cabling 602 may be connected to connectors (not visible) on the bottom edge 202d of the compute module 200. While not illustrated, one of skill in the art in possession of the present disclosure will appreciate how a compute module component (e.g., an SSD) may be connected to the compute module 200 such that the component i positioned adjacent the rear surface 202c of the compute module 200, with the component located in the device bracket housing 310c when the device bracket 300 is mounted to the compute module 200 as discussed above, and cabling from that component may be routed through the connector/plug clearance feature 309 defined by the compute module 200. Furthermore, FIG. 6D illustrates how the mounting feedback mechanism 318a is mounted to the device bracket 300 adjacent the wall mounting aperture 314a, and the mounting feedback mechanism 318b is mounted to the device bracket 300 adjacent the wall mounting aperture 314b.

The method 500 then proceeds to decision block 504 where the method 500 proceeds depending on whether the device/device bracket combination will mount directly to a support surface (e.g., to provide the relatively low-cost support surface mounting solution discussed above) or to a support surface mount (e.g., to provide the relatively higher cost support surface mounting solution discussed above). As will be appreciated by one of skill in the art in possession of the present disclosure, a user may purchase the device bracket 300 in order to couple the compute module 200 to a wall or other support surface in situations in which the security of the compute module 200 is not an issue, and may purchase the support surface/wall mount 400 in order to couple the compute module 200 to a wall or other support surface in situations in which the security of the compute module 200 is an issue. Furthermore, one of skill in the art in possession of the present disclosure will recognize that the device bracket 300 allows the compute module 200 to be moved between the two support surface mounting solutions described herein quickly and easily as described in the method 500 below.

Figure 7A:
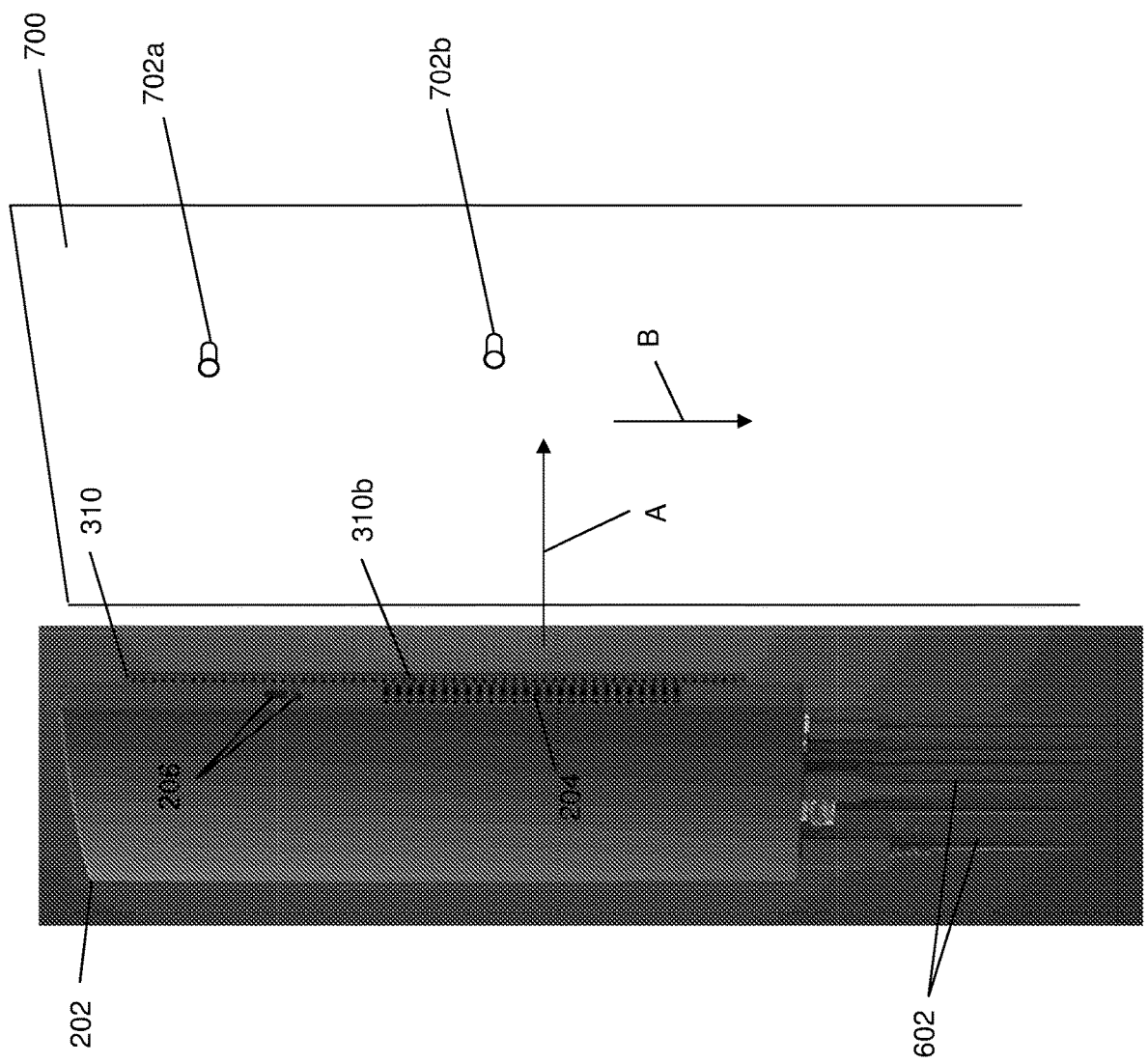
FIG. 7A is a front perspective view illustrating the compute module bracket of FIG. 3 coupled to the compute module of FIG. 2 and being mounted to a wall.
Figure 7B:
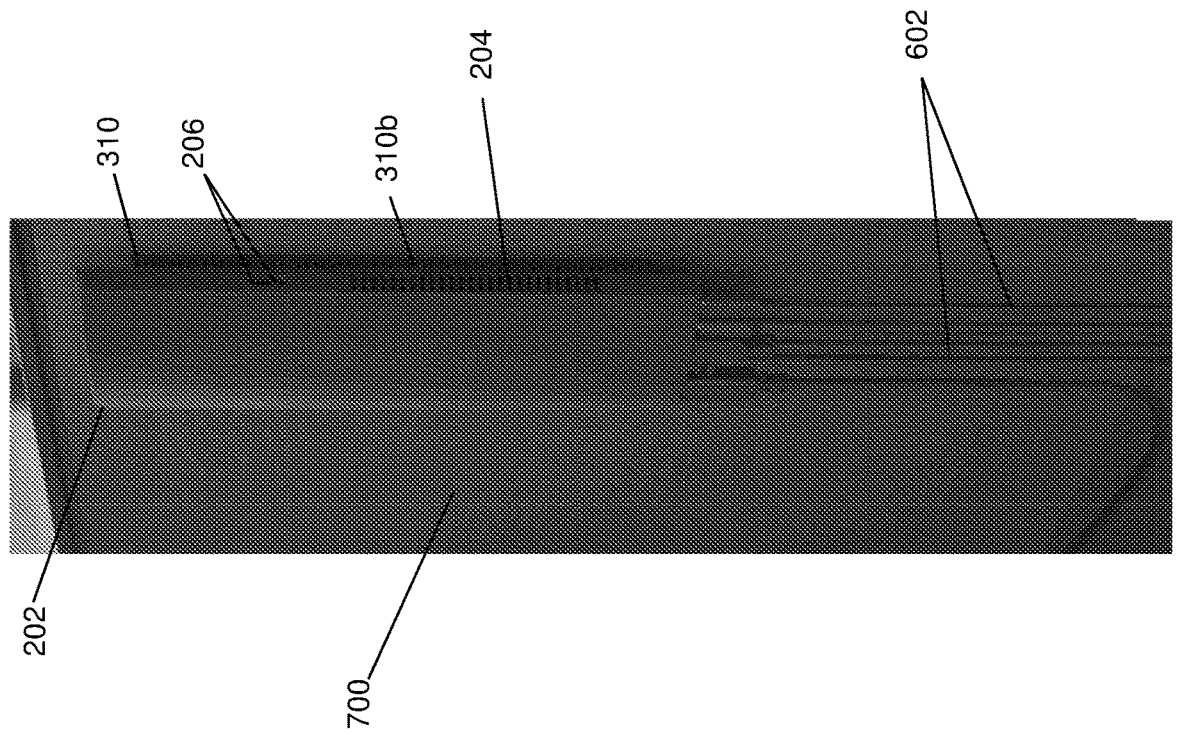
FIG. 7B is a front perspective view illustrating the compute module bracket of FIG. 3 coupled to the compute module of FIG. 2 and mounted to a wall.

If at decision block 504, the device/device bracket will mount directly to a support surface, the method 500 proceeds to block 506 where mounting post(s) are provided on the support surface. In an embodiment, at block 506, the user may provide mounting posts on the support surface to which the compute module 200/device bracket 300 will be mounted. For example, FIG. 7A illustrates a wall support surface 700, and a user wishing to mount the compute module 200/device bracket 300 directly to the wall support surface 700 may provide mounting posts 702a and 702b (e.g., screws in the illustrated example) in the wall support surface 700 in a spaced apart orientation corresponds to the spacing of the wall mounting apertures 314a and 314b on the device bracket 300. However, while a wall support surface 700 is illustrated and described, one of skill in the art in possession of the present disclosure will recognize that the device bracket 300 allows the compute module 200 to be mounted to any of a variety of other types of support surfaces that will fall within the scope of the present disclosure as well.

The method 500 then proceeds to block 508 where mounting post mounting element(s) on the device bracket are engaged with the mounting post(s). With reference to FIG. 7A, in an embodiment of block 508, the compute module 200/device bracket 300 may be positioned adjacent the wall support surface 700 such that the primary wall 310a on the device bracket 300 faces the wall support surface 700, with the wall mounting apertures 314a and 314b on the device bracket 300 aligned with the mounting posts 702a and 702b, respectively. The compute module 200/device bracket 300 may then be moved in a direction A such that the mounting posts 702a and 702b move through the wall mounting apertures 314a and 314b, respectively, on the device bracket 300. compute module 200/device bracket 300 may then be moved in a direction B to secure the mounting posts 702a and 702b in the wall mounting apertures 314a and 314b on the device bracket 300, respectively. As will be appreciated by one of skill in the art in possession of the present disclosure, the securing of the mounting posts 702a and 702b in the wall mounting apertures 314a and 314b, respectively, will cause the mounting posts 702a and 702b to engage the mounting feedback mechanisms 318a and 318b, respectively, on the device bracket 300 to provide feedback (e.g., an audible "click") that indicates to the user that the device bracket 300 is secured to the wall support surface 700, and thus that the compute module 200 is safely mounted to the wall support surface 700.

As will be appreciated by one of skill in the art in possession of the present disclosure, the compute module 200/device bracket 300 may be disconnected from the wall support surface 700 by first moving the compute module 200/device bracket 300 opposite the direction B, and then moving the compute module 200/device bracket 300 opposite the direction A such that the mounting posts 702a and 702b are removed from the wall mounting apertures 314a and 314b, respectively. As will be appreciated by one of skill in the art in possession of the present disclosure, the movement of the compute module 200/device bracket 300 opposite the direction B will cause the mounting posts 702a and 702b to engage the mounting feedback mechanisms 318a and 318b, respectively, on the device bracket 300 to provide feedback (e.g., an audible "click") that indicates to the user that the device bracket 300 has been unsecured from the wall support surface 700, and that the compute module 200/device bracket 300 may be moved opposite the direction A to disconnect the compute module 200 from the wall support surface 700.

Figure 8A:
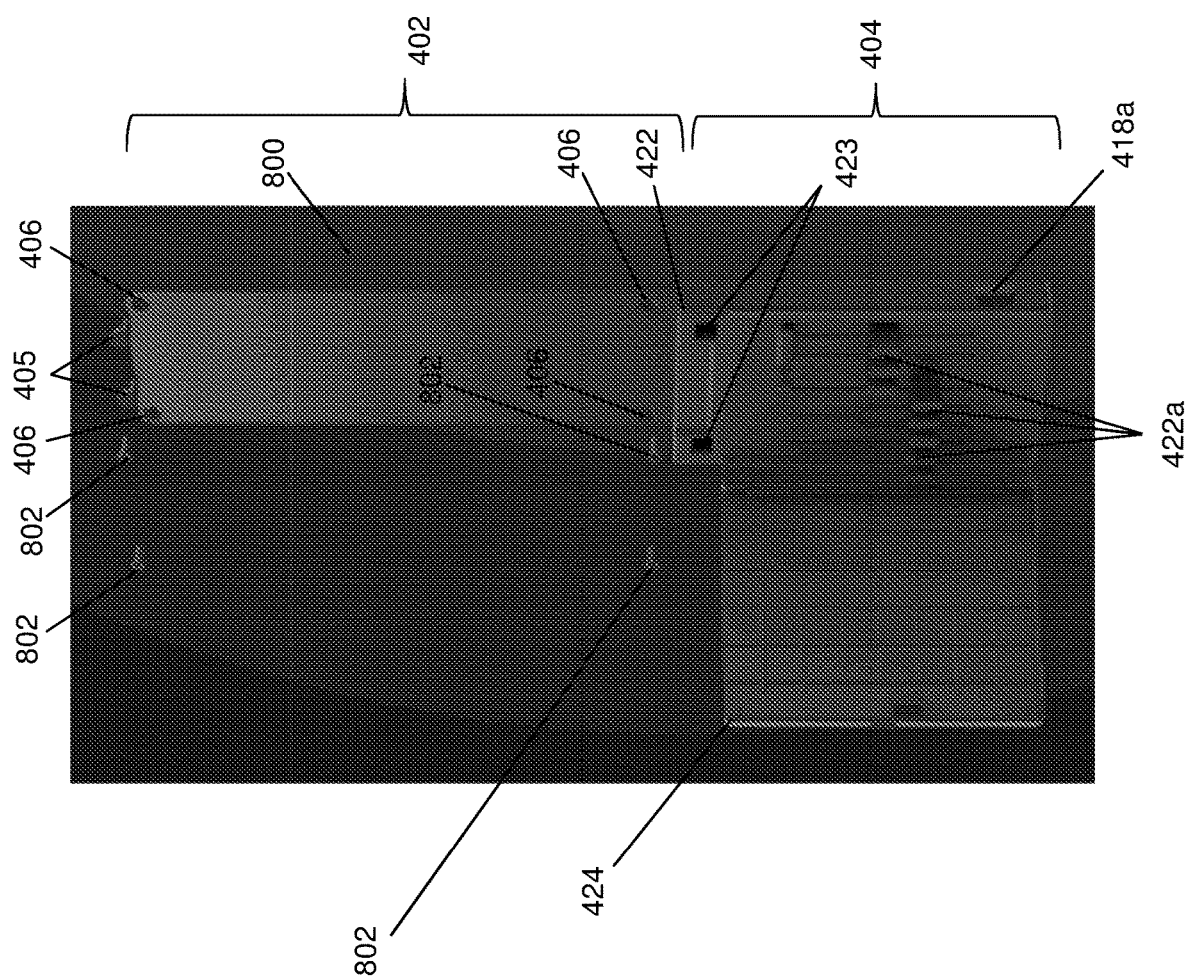
FIG. 8A is a perspective view illustrating an embodiment of the wall mount of FIGS. 4A-4C being coupled to a wall.
Figure 8B:
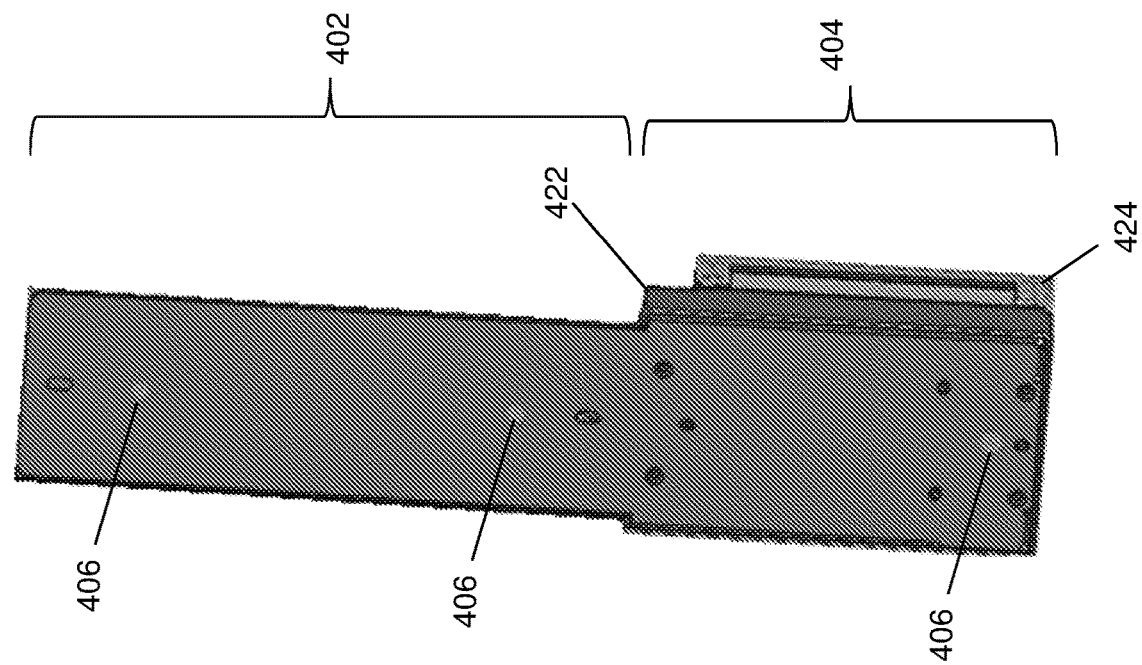
FIG. 8B is a perspective view illustrating an embodiment of the wall mount of FIGS. 4A-4C with alternate wall coupling features for mounting to a wall.
Figure 8C:
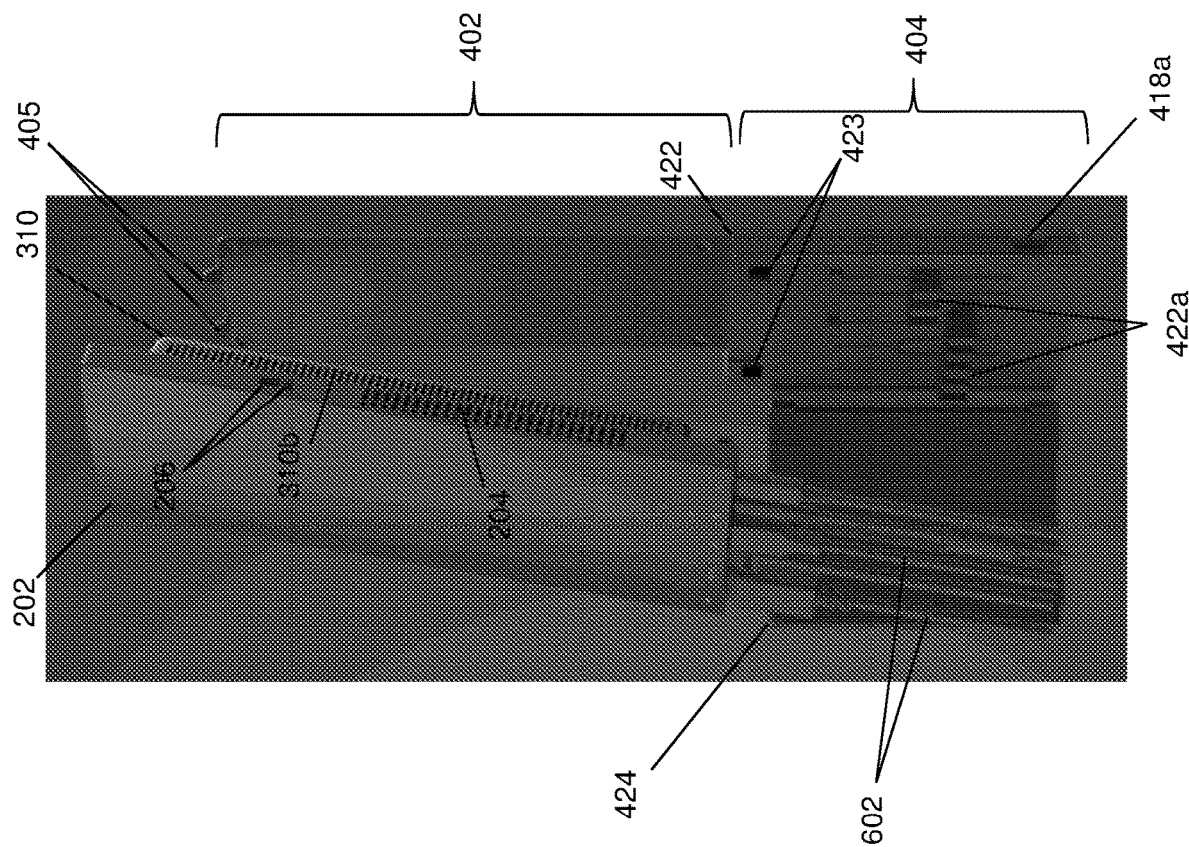
FIG. 8C is a perspective view illustrating an embodiment of the compute module bracket of FIG. 3 coupled to the compute module of FIG. 2 and being mounted to the wall mount of FIGS. 4A-4C.

If at decision block 504, the device/device bracket will mount to the support surface mount, the method 500 proceeds to block 510 where the support surface mount is mounted to the support surface. In an embodiment, at block 510, the user may provide the support surface mount of the present disclosure on the support surface to which the compute module 200/device bracket 300 will be mounted. For example, FIG. 8A illustrates a wall support surface 800, and a user wishing to couple the compute module 200/device bracket 300 to the wall support surface 800 via the wall mount 400 may position the wall mount 400 adjacent the wall support surface 800, and provide mounting elements 802 (e.g., screws in the illustrated example) in the wall mounting apertures 406 on the wall mount 400 and in engagement with the wall support surface 700 to mount the wall mount 400 to the wall support surface 800. As will be appreciated by one of skill in the art in possession of the present disclosure, FIG. 8A illustrates the wall mounting apertures 406 in a square orientation, while FIG. 8B illustrates the wall mounting apertures 406 in a linear orientation, and either embodiment of wall mounting apertures 406 allow the wall mount 400 to be mounted to the wall support surface 800. However, while a wall support surface 800 is illustrated and described, one of skill in the art in possession of the present disclosure will recognize that the support surface mount and the device bracket 300 allow the compute module 200 to be mounted to any of a variety of other types of support surfaces that will fall within the scope of the present disclosure as well The method 500 then proceeds to block 512 where support surface mount mounting elements on the device bracket are engaged with the support surface mount. With reference to FIG. 8C, in an embodiment of block 512, the compute module 200/device bracket 300 may be positioned adjacent the wall mount 400 such that the such that the primary wall 310a on the device bracket 300 faces the support surface 700, and the wall mount coupling members 308 and the wall mount coupling apertures 320 on the device bracket 300 are aligned with the device bracket coupling apertures 423 and the device bracket mounting elements 405 on the wall mount 400, respectively. FIG. 8C also illustrates how the compute module 200/device bracket 300 may then be moved towards the wall mount 400 to first engage the device bracket mounting elements 405 on the wall mount 400 with the wall mount coupling apertures 320 on the device bracket 300, and then rotated about the engaged device bracket mounting elements 405/wall mount coupling apertures 320 to engage the wall mount coupling members 308 on the device bracket 300 with the device bracket coupling apertures 423 on the wall mount 400. However, while discussed as being rotated to engage the device bracket 300 and the wall mount 400, one of skill in the art in possession of the present disclosure will appreciate that the device bracket 300 and the wall mount 400 may be engaged (and in some situations, locked) using a linear "up-and-down" or "front-to-back" motion, and/or other engagement techniques known in the art.

Figure 8D:
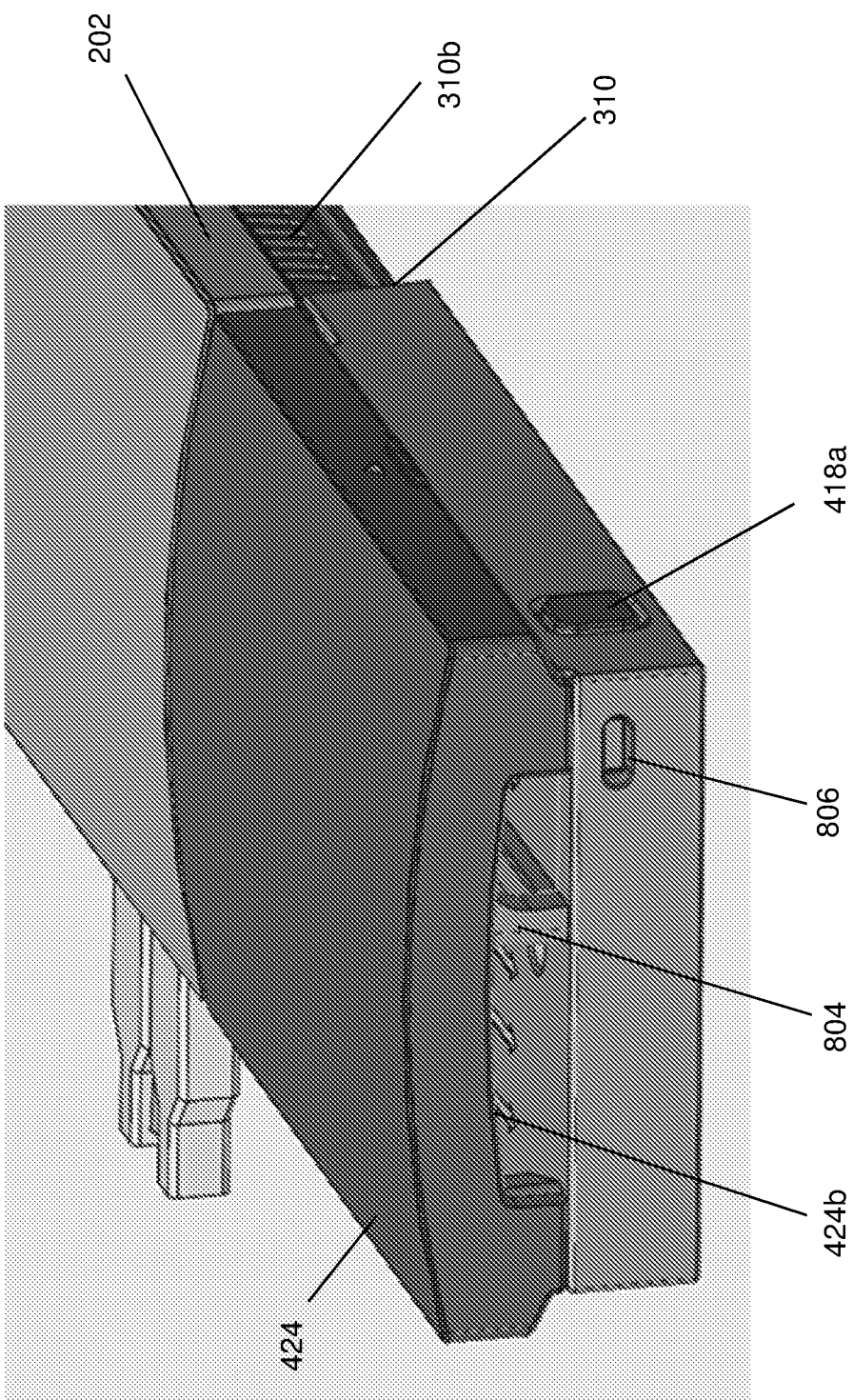
FIG. 8D is a perspective view illustrating an embodiment of the cable door on the wall mount of FIGS. 4A-4C that is mounted to the compute module bracket of FIG. 3 coupled to the compute module of FIG. 2.
Figure 8E:
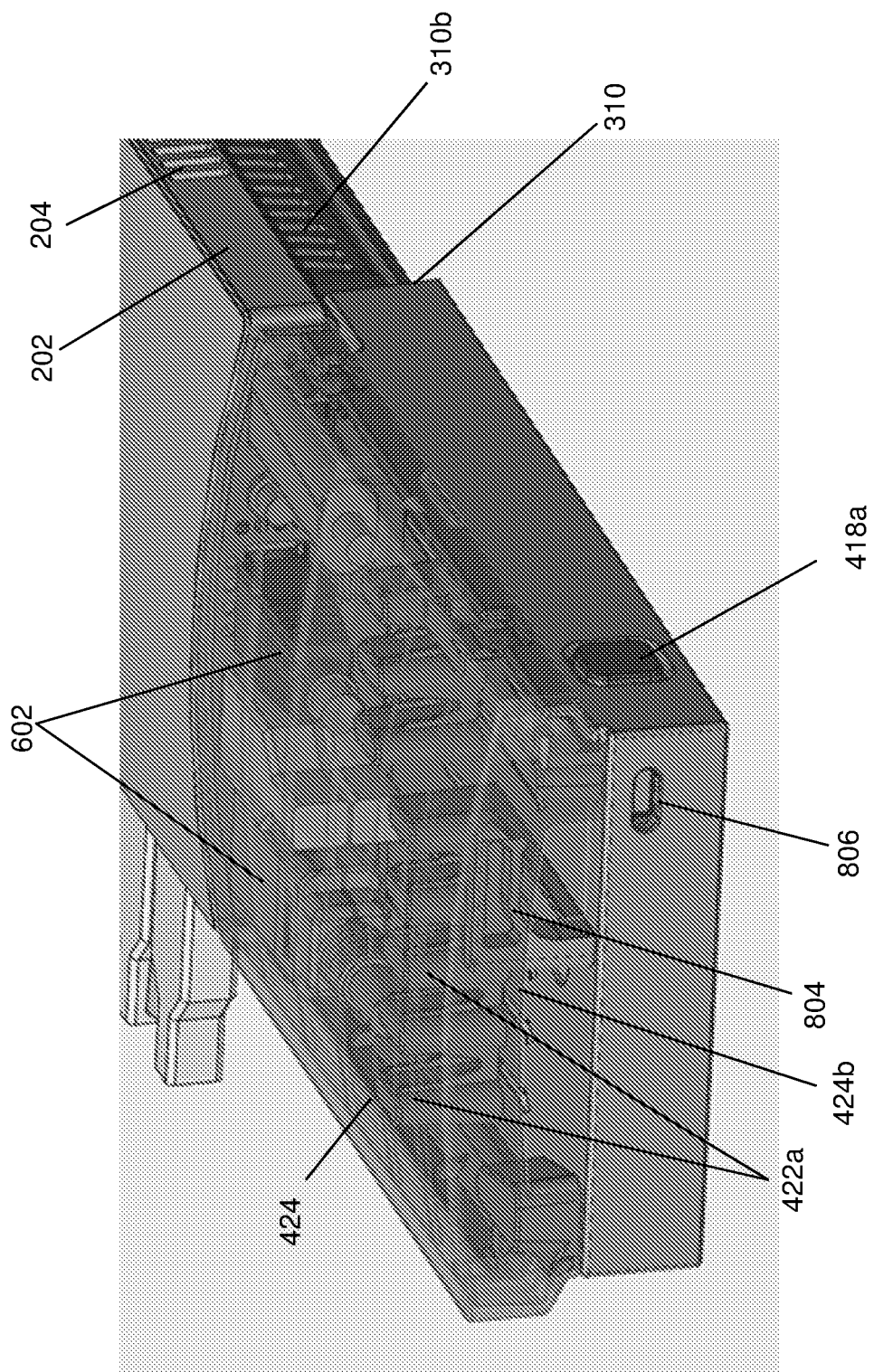
FIG. 8E is a partially transparent perspective view illustrating an embodiment of the cable door on the wall mount of FIGS. 4A-4C that is mounted to the compute module bracket of FIG. 3 coupled to the compute module of FIG. 2.
Figure 8F:
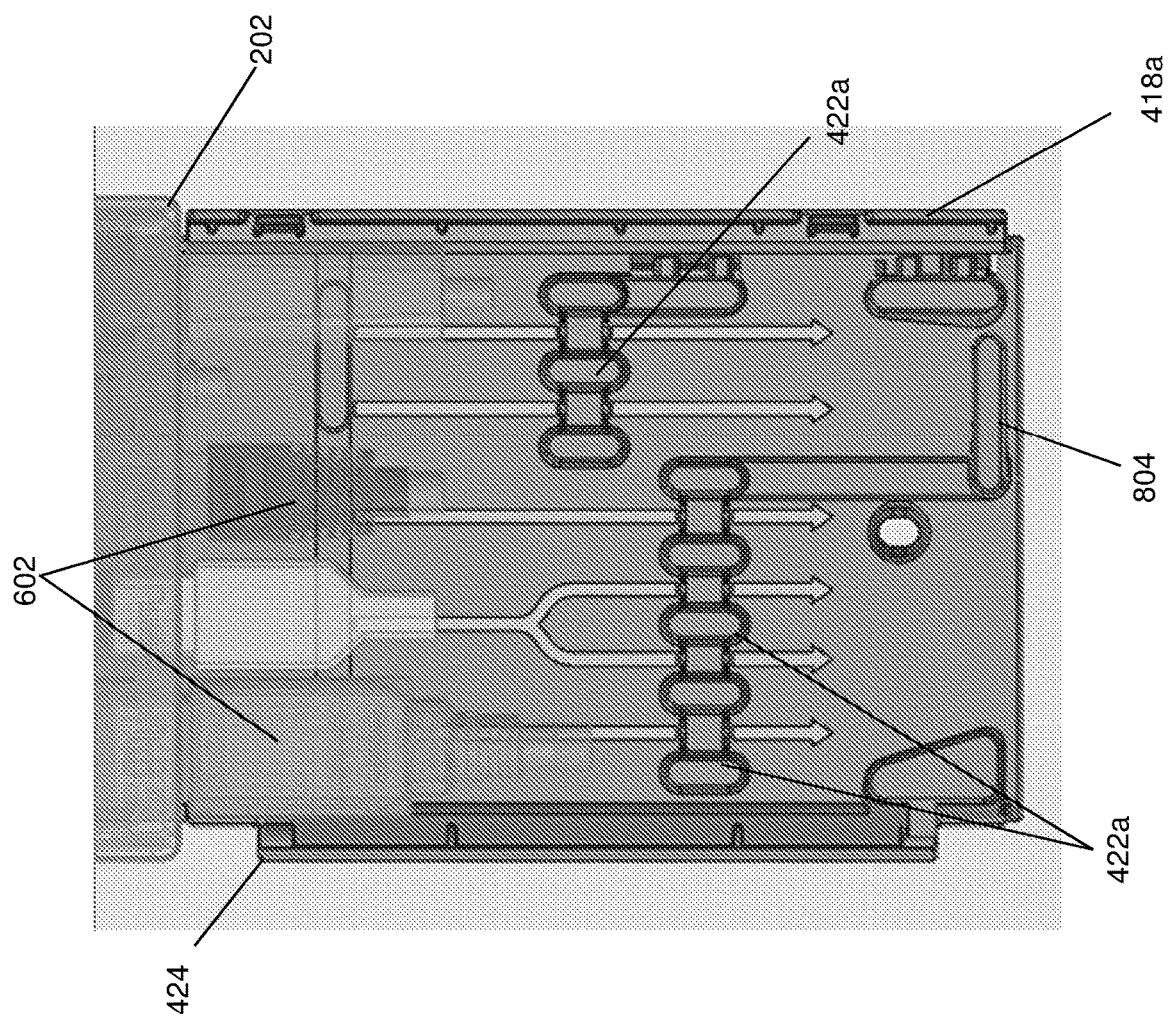
FIG. 8F is a front view illustrating an embodiment of cable routing on the wall mount of FIGS. 4A-4C that is mounted to the compute module bracket of FIG. 3 coupled to the compute module of FIG. 2.
Figure 8G:
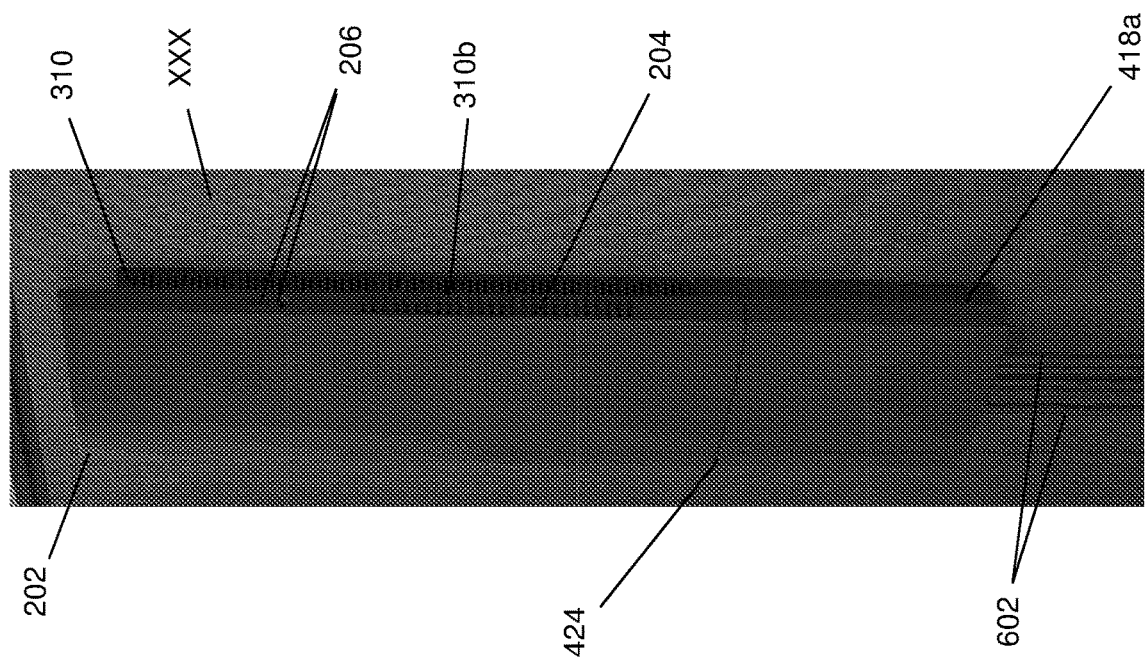
FIG. 8G is a perspective view illustrating an embodiment of the compute module bracket of FIG. 3 coupled to the compute module of FIG. 2 and mounted to the wall mount of FIGS. 4A-4C.

With reference to FIGS. 8C-8G, the engagement of the support surface mount mounting elements on the device bracket 300 with the wall mount 400 at block 512 allows the cabling 602 connected to the compute module 200 to be managed via the securing member 404 on the wall mount 400. For example, FIG. 8C illustrates how the securing door 424 on the wall mount 400 may be provided in an open orientation such that the cabling 602 may be positioned in the cable routing channels defined between the cable routing elements 422a included in the cable routing base 422. In some embodiments, the cable routing elements 422a may be movable relative to the cable routing base 422 to allow them to be moved adjacent connectors on the cabling 602 in order to secure those connectors to the compute module 200. FIGS. 8D, 8E, and 8G illustrate how the securing door 424 may be provided in a closed orientation, and how a cabling aperture 424b defined by the securing door 424 allows the cabling 602 to extend from the securing member 404 on the wall mount 400 (e.g., while trapping and compressing the cabling 602 between the securing door 424 and the cable routing base 422 in order to prevent removal and/or disconnection of the cabling 602 from the compute module 200). Furthermore, FIGS. 8D and 8E illustrate how the cable routing base 422 may also include a cabling clamp 804 that may engage the cabling 602 to prevent disconnection of the cabling 602 from the compute module 200 due to, for example, pulling on the cabling 602 that extend from the wall mount 400 in a direction that is perpendicular to the wall support surface 800. Further still, FIGS. 8D and 8E also illustrate how the cable routing base 422 may define a locking aperture 806 adjacent the release member 418a, which is discussed in further detail below.

Figure 9A:
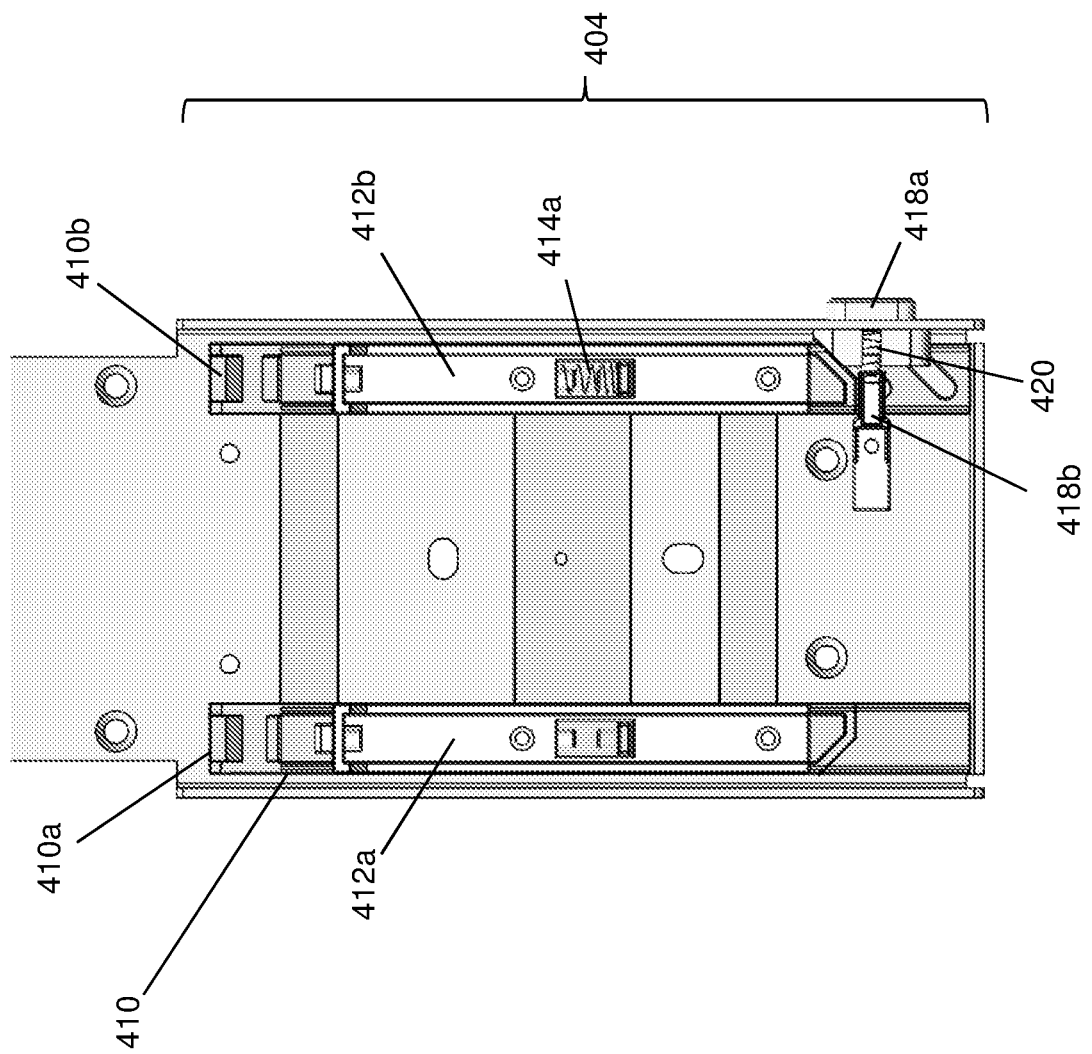
FIG. 9A is a cross-sectional view illustrating an embodiment of a latching mechanism on the wall mount of FIGS. 4A-4C in a securing orientation.
Figure 9B:
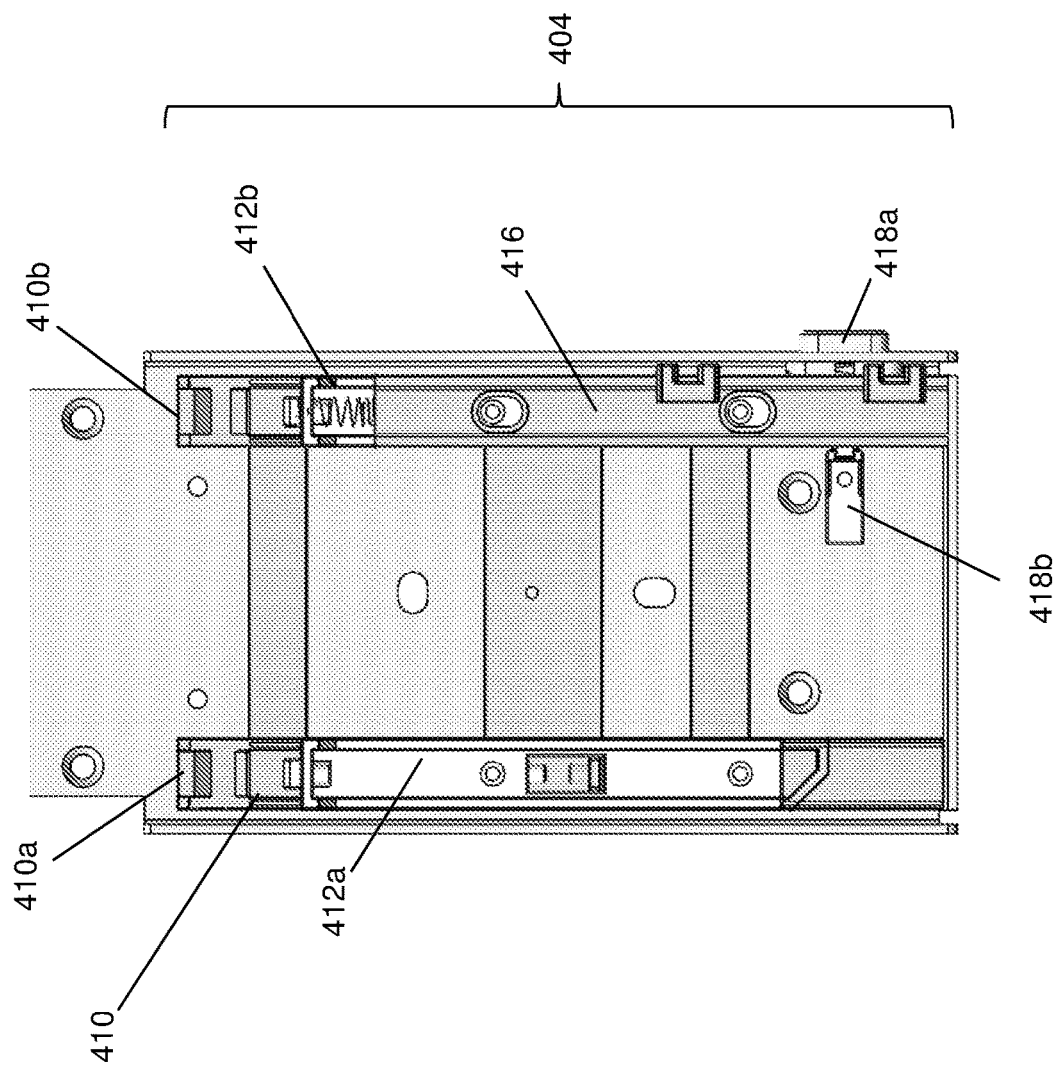
FIG. 9B is a cross-sectional view illustrating an embodiment of a locking element on the wall mount of FIGS. 4A-4C in an unlocked orientation.
Figure 9C:
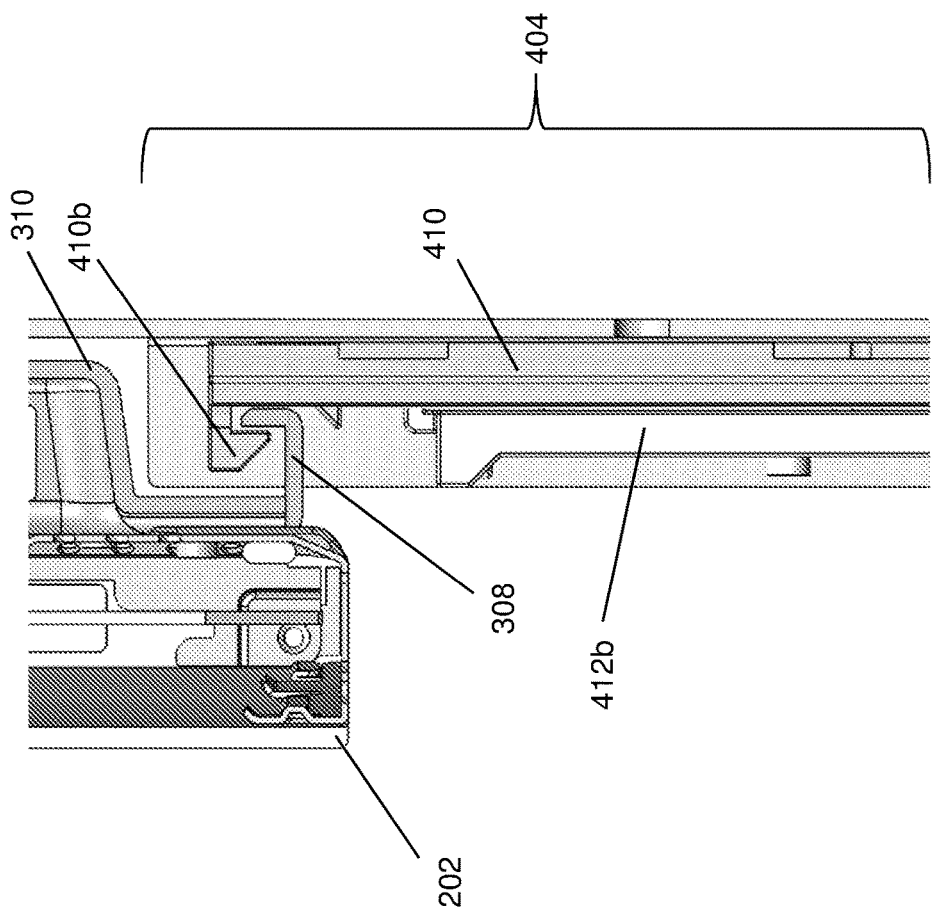
FIG. 9C is a cross-sectional view illustrating an embodiment of the latching mechanism of FIG. 10A in the secured orientation.
Figure 9D:
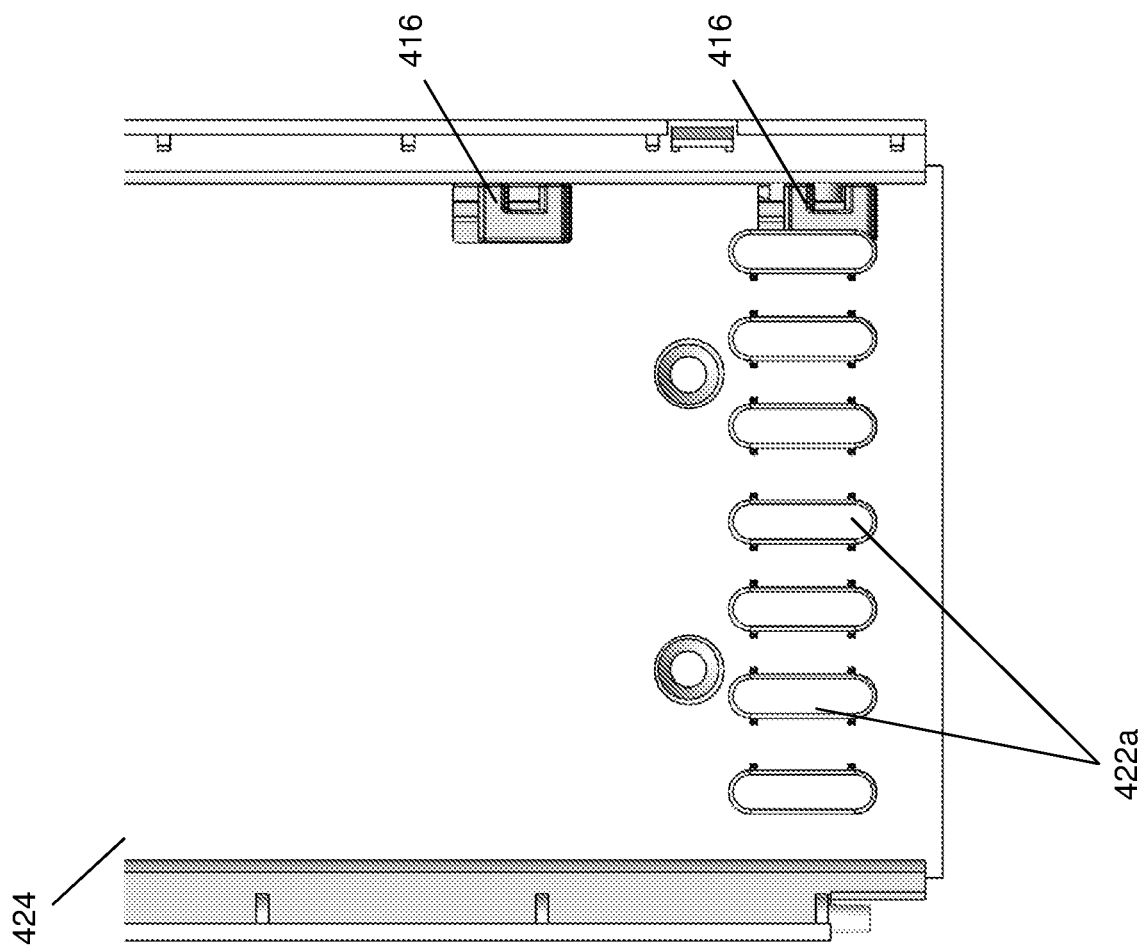
FIG. 9D is a front view illustrating an embodiment of the locking element of FIG. 10B in the unlocked orientation.

The method 500 then proceeds to block 514 where the device bracket is engaged with a securing latch on the support surface mount to move the securing latch into a secured orientation. As will be appreciated by one of skill in the art in possession of the present disclosure, in an embodiment of block 514 and in the process of engaging the support surface mount mounting elements on the device bracket 300 with the wall mount 400, the latching subsystem illustrated in the exploded view in FIG. 4B will operate to secure the device bracket 300 to the wall mount 400. For example, FIGS. 9A, 9B, 9C, and 9D illustrate the securing latch member 410 in a secured orientation, and the locking element 416 in an unlocked orientation. As will be recognized by one of skill in the art in possession of the present disclosure, FIG. 9C illustrates how the engagement of the wall mount coupling members 308 on the device bracket 300 with the device bracket coupling apertures 423 on the wall mount 400 will cause a wall mount coupling member 308 on the device bracket 300 to engage the securing latch 410b and move the securing latch 410b into the securing orientation illustrated in FIG. 9C and, while not illustrated, one of skill in the art in possession of the present disclosure will appreciate how a wall mount coupling member 308 on the device bracket 300 will engage the securing latch 410a to move the securing latch 410a into the securing orientation in a substantially similar manner as well. As will be appreciated by one of skill in the art in possession of the present disclosure, with the securing latches 410a and 410b engaging the wall mount coupling members 308 as illustrated in FIG. 9C, the wall mount 400 may hold the compute module 200/device bracket 300 in the vertical orientation illustrated herein, as well as horizontal orientations and/or other orientations that will fall within the scope of the present disclosure as well. Furthermore, FIGS. 9A and 9B illustrate the release member 418a in an unactuated orientation, and FIGS. 9B and 9D illustrate the locking element 416 in an unlocked orientation as well.

Figure 10A:
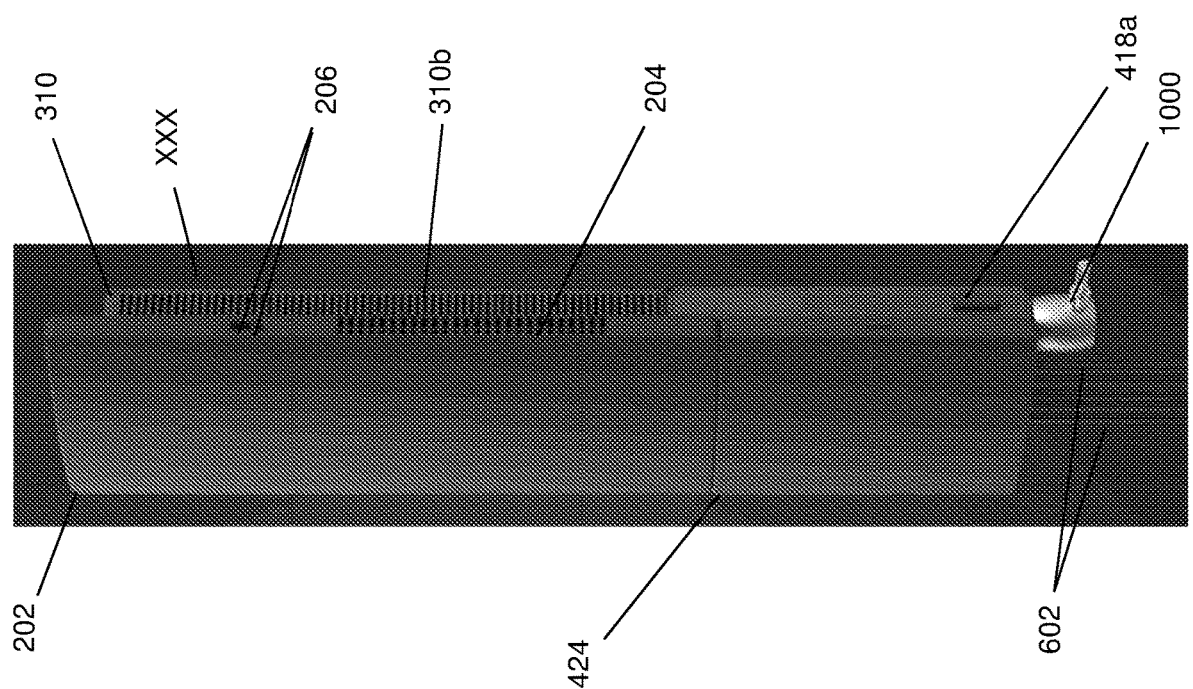
FIG. 10A is a perspective view illustrating an embodiment of the compute module bracket of FIG. 3 coupled to the compute module of FIG. 2, and mounted and locked to the wall mount of FIGS. 4A-4C.
Figure 10B:
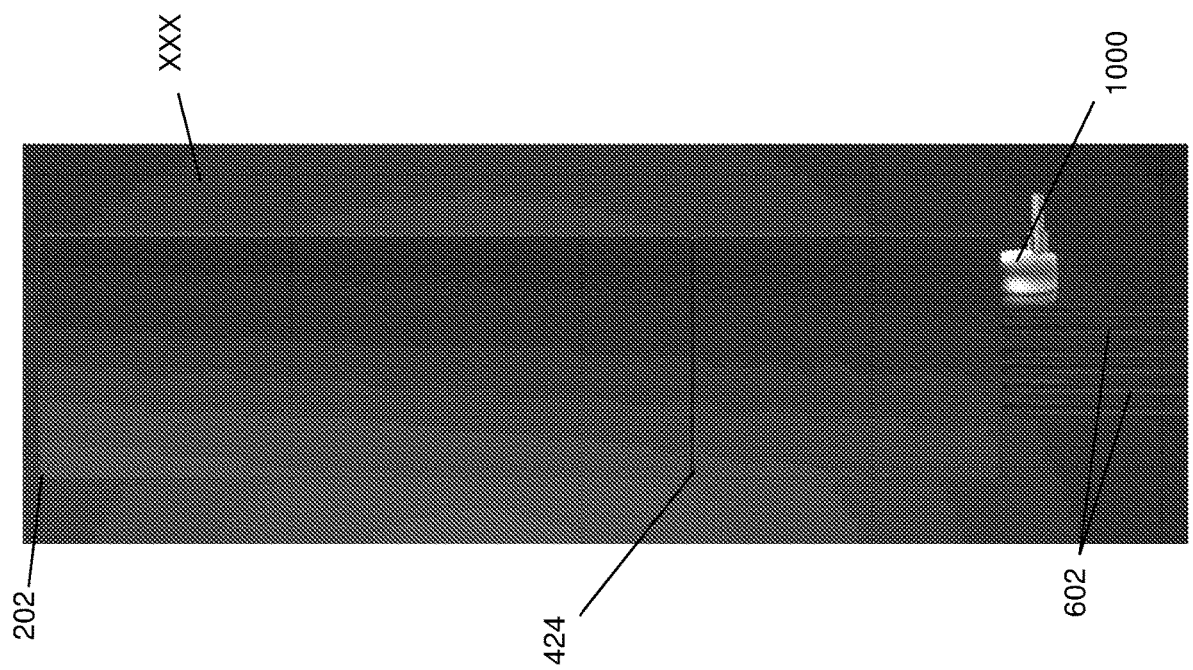
FIG. 10B is a front view illustrating an embodiment of the compute module bracket of FIG. 3 coupled to the compute module of FIG. 2, and mounted and locked to the wall mount of FIGS. 4A-4C.
Figure 11A:
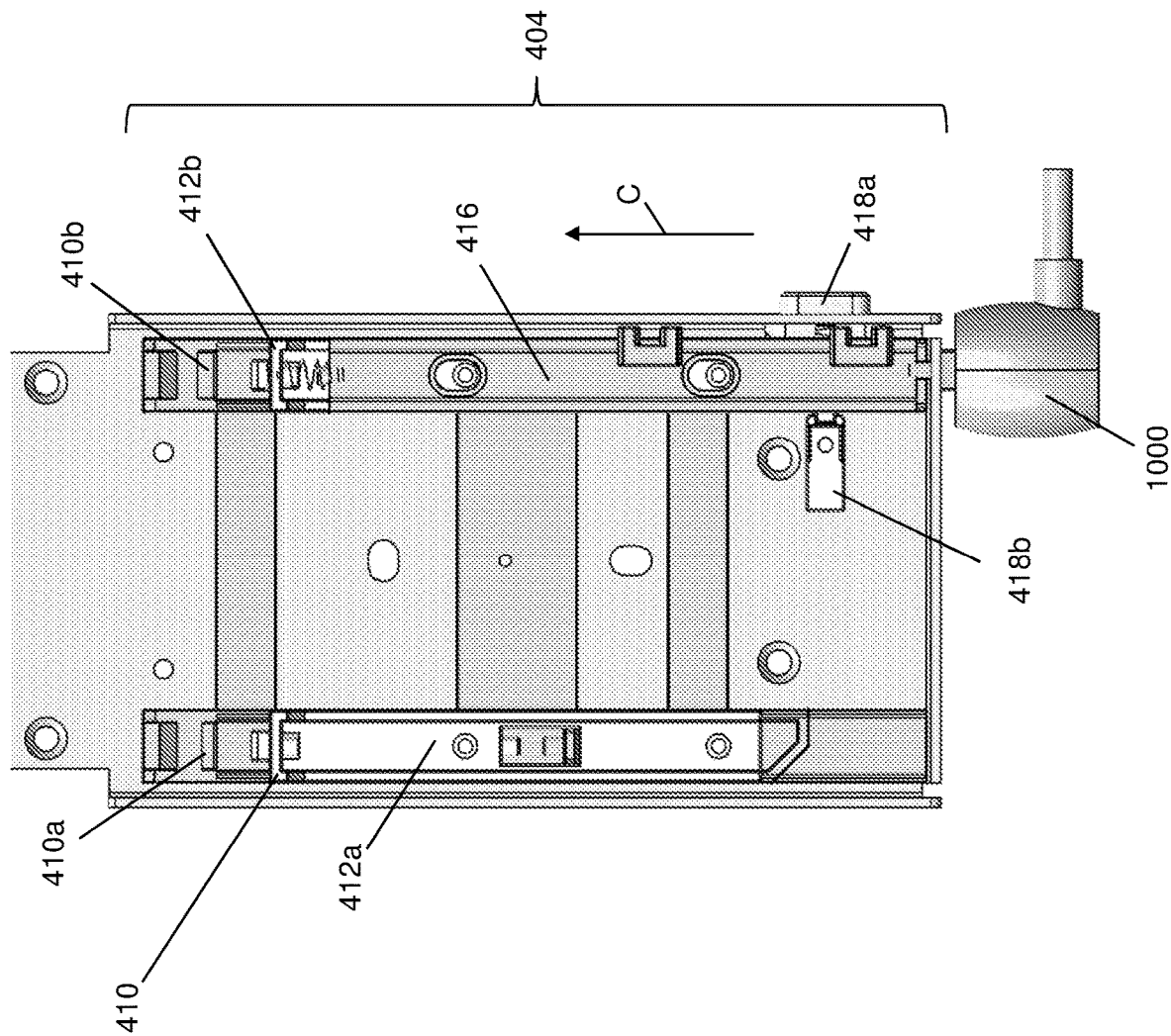
FIG. 11A is a cross-sectional view illustrating an embodiment of the locking element on the wall mount of FIGS. 4A-4C in a locked orientation.
Figure 11B:
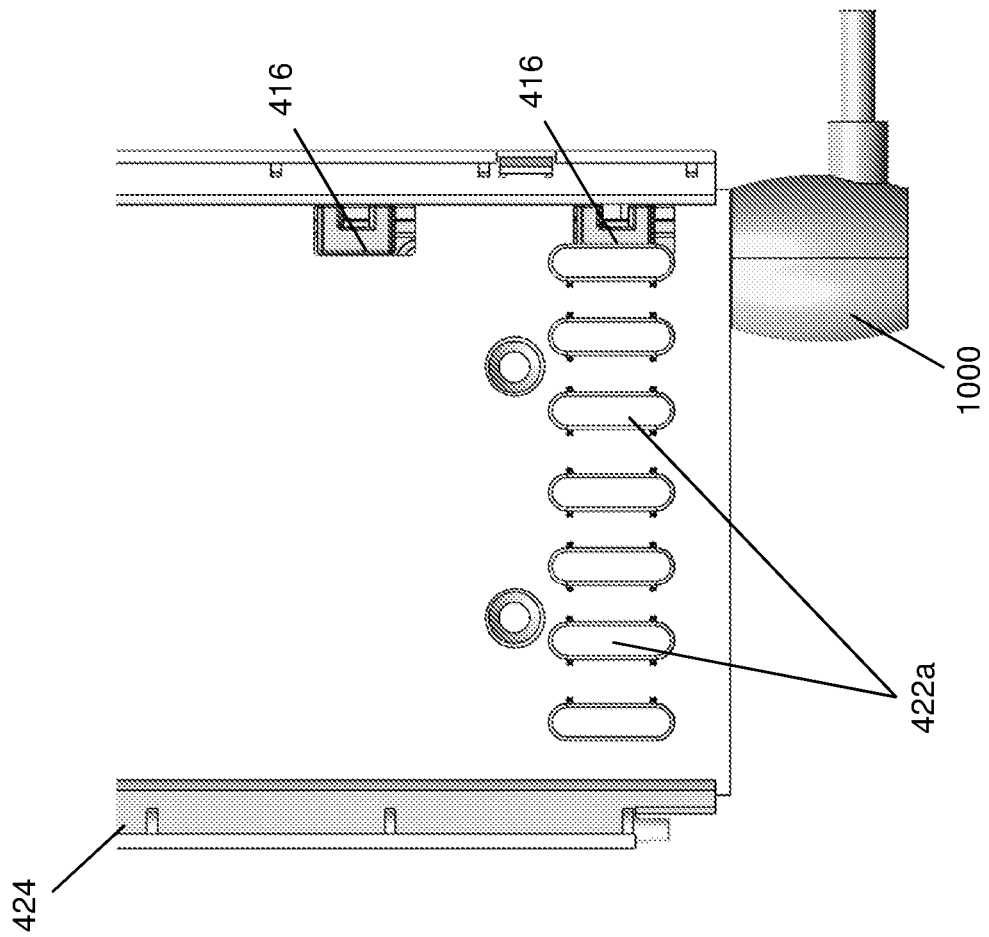
FIG. 11B is a front view illustrating an embodiment of the locking element of FIG. 11A in the locked orientation.
Figure 12A:
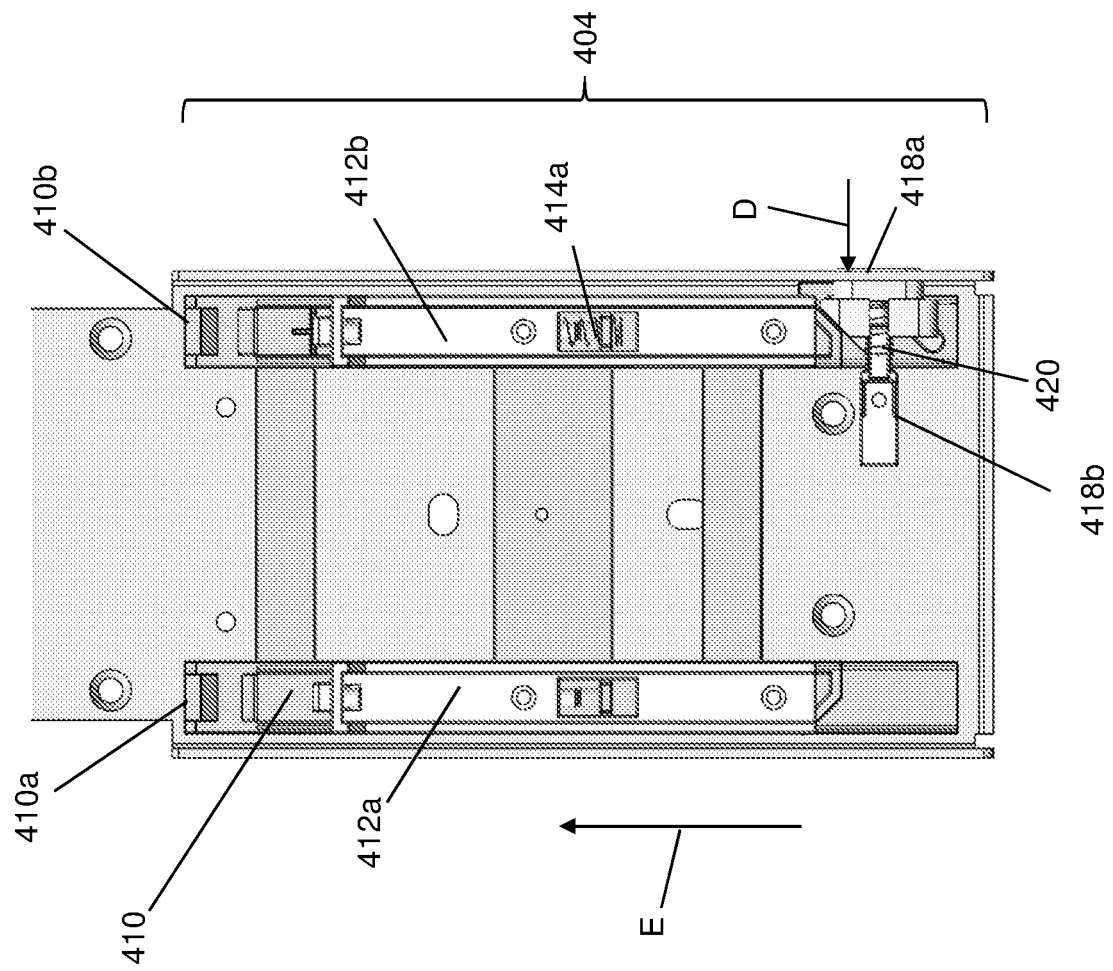
FIG. 12A is a cross-sectional view illustrating an embodiment of the latching mechanism on the wall mount of FIGS. 4A-4C in an unsecured orientation.
Figure 12B:
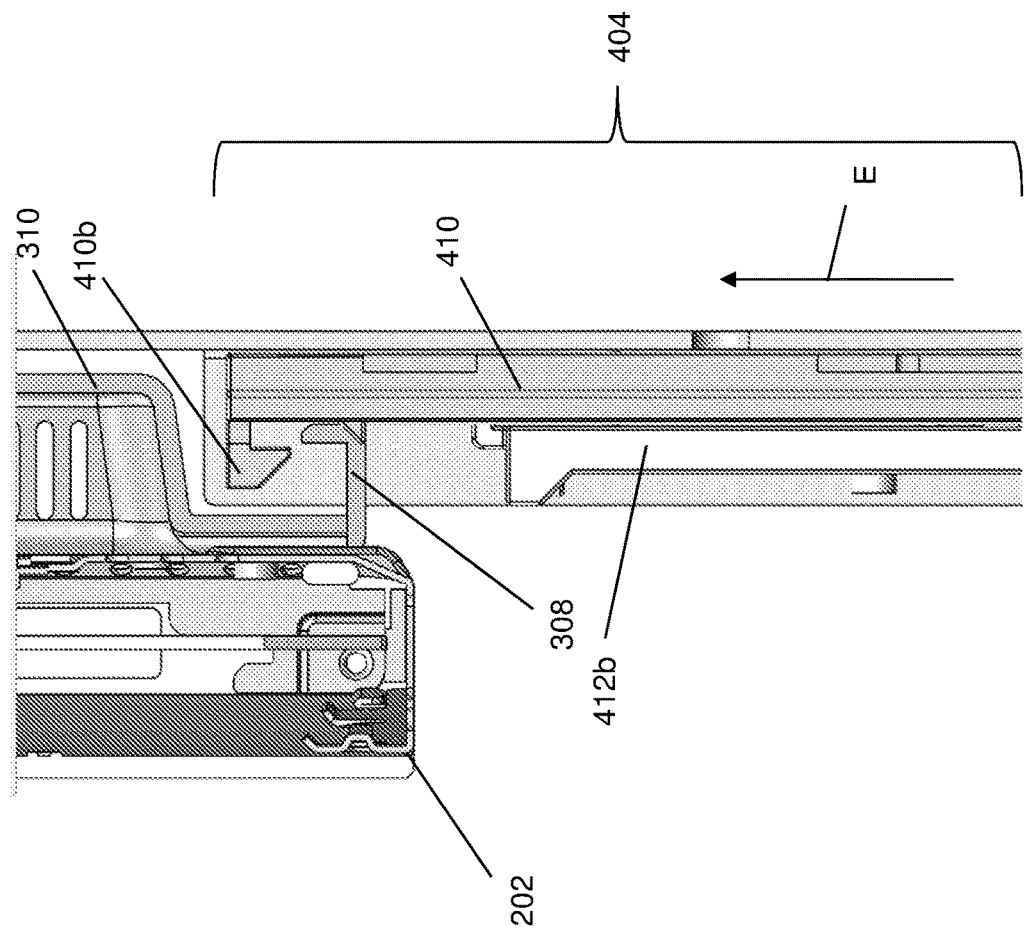
FIG. 12B is a cross-sectional view illustrating an embodiment of the latching mechanism of FIG. 12A in the unsecured orientation.

The method 500 then proceeds to block 516 where a locking element on the support surface mount is actuated to prevent movement of the securing latch to an unsecure orientation. In an embodiment, at block 516, the locking element 416 in the securing member 404 on the wall mount 400 may be actuated to prevent movement of the securing latch member 410 from the secured orientation illustrated in FIGS. 9A-9D to an unsecured orientation (discussed in further detail below). For example, FIGS. 10A and 10B illustrate how a locking device 1000 (e.g., a KENSINGTON® locking device available from KENSINGTON® of San Mateo, Calif., United States) may be positioned in the locking aperture 806 defined by the cable routing base 422 on the securing member 404 of the wall mount 400, which prevents movement of the securing latch member 410 to an unsecured orientation and prevents disengagement of the securing latches 410a and 410b from the wall mount coupling members 308 on the device bracket 300, thus locking the device bracket 300 to the wall mount 400. For example, FIGS. 11A and 12B illustrate how the locking device 1000 engages the locking element 416 in the securing member 404 on the wall mount 400 to move the locking element 416 in a direction C, which operates to cause the locking element 416 to engage both the release member 418a and the securing door 424 in order to prevent actuation of the release member 418a (discussed in further detail below), as well as prevent movement of the securing door 424 from the closed orientation to the open orientation illustrated in FIG. 8C. As such, with the locking device 1000 connected to the securing member 404 of the wall mount 400, the securing door 424 is locked to prevent access to the cabling 602 extending from the compute module 200, and the release member 418a is disabled to prevent disconnection of the compute module 200/device bracket 300 from the wall mount 400.

As will be appreciated by one of skill in the art in possession of the present disclosure, the compute module 200/device bracket 300 may be disconnected from the wall mount 400 by first disconnecting the locking device 1000 from the securing member 404 on the wall mount 400 (i.e., by removing the locking device 1000 from the locking aperture 806 defined by the cable routing base 422 on the securing member 404 of the wall mount 400) in order to unlock the securing door 424 and allow actuation of the release member 418a. With reference to FIG. 12A, a user may then provide a force on the release member 418a to move the release member 418a in a direction D, which causes the release member 418a to engage the securing latch member 410 and move the securing latch member 410 in a direction E. As illustrated in FIG. 12B, the movement of the securing latch member 410 in the direction E causes the securing latch 410b to disengage the wall mount coupling member 308 and move into an unsecured orientation and, while not illustrated, one of skill in the art in possession of the present disclosure will appreciate how the securing latch 410a will disengage the wall mount coupling member 308 and move into the unsecured orientation in a substantially similar manner as well. As such, the user may then remove the wall mount coupling members 308 from the device bracket coupling apertures 423 on the wall mount 400, and then remove the device bracket mounting elements 405 on the wall mount 400 from the wall mount coupling apertures 320 on the device bracket 300, thus disconnecting the compute module 200/device bracket 300 from the wall mount 400.

Thus, systems and methods have been described that provide a "two-in-one" support surface mounting system that enables a relatively low-cost support surface mounting solution for compute modules, as well as a relatively higher cost and more secure support surface mounting solution those compute modules. The compute module support surface mounting system includes a bracket that couples to a compute module. For the relatively low-cost support surface mounting solution, at least one second support surface mounting element on the bracket may be engaged with at least one mounting post on a support surface to mount the compute module directly to the support surface via the bracket. For the relatively higher cost and more secure support surface mounting solution, a support surface mount is provided that includes a base member mounts to the support surface, and a securing member that extends from the base member. A securing latch is included in the securing member and may be provided in a secured orientation in which the securing latch engages the bracket when the bracket is coupled to the support surface mount in order to secure the compute module to the support surface mount via the bracket, and an unsecured orientation that allows the compute module to be decoupled (via the bracket) from the support surface mount when the device bracket is coupled to the support surface mount. A release member is included in the securing member and moves the securing latch between the secured orientation and the unsecured orientation. A locking element is included in the securing member and may be actuated to prevent movement of the securing latch from the secured orientation to the unsecured orientation in order to lock the compute module 200 to the support surface mount via the bracket. As such, support surface mounting solutions are provided for compute modules that enable the securing of those compute modules when desired Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A device mounting system, comprising:
 a device bracket that is configured to couple to a device; and
 a support surface mount that is configured to couple to the device bracket, wherein the support surface mount includes:
  a base member that is configured to mount to a support surface;
  a securing member that extends from the base member;
  a securing latch that is included in the securing member and that is configured to be provided in:
   a secured orientation in which the securing latch engages the device bracket when the device bracket is coupled to the support surface mount in order to secure the device bracket to the support surface mount; and
   an unsecured orientation that allows the device bracket to be decoupled from the support surface mount when the device bracket is coupled to the support surface mount;
  a release member that is configured to move the securing latch between the secured orientation and the unsecured orientation; and
  a locking element that is included in the securing member and that is configured to be actuated to prevent movement of the securing latch from the secured orientation to the unsecured orientation in order to lock the device bracket to the support surface mount.

2. The system of claim 1, wherein the device bracket includes:
 at least one first support surface mounting element that is configured to couple the device bracket to the support surface mount; and
 at least one second support surface mounting element that is configured to engage at least one mounting post to mount the device bracket to a support surface without using the support surface mount.

3. The system of claim 2, wherein at least one second support surface mounting element includes:
 a mounting feedback mechanism that is configured to provide feedback when the at least one second support surface mounting element engages the at least one mounting post to mount the device bracket to the support surface without using the support surface mount.

4. The system of claim 1, wherein the support surface mount includes:
at least one cable routing subsystem that is included on the securing member and that is configured to engage at least one cable that is connected to a device when the device is coupled to the device bracket and the device bracket is coupled to the support surface mount.

5. The system of claim 1, wherein the support surface mount includes:
a securing door that is configured to be provided in:
an open orientation that allows access to at least one cable that is connected to the device when the device is coupled to the device bracket and the device bracket is coupled to the support surface mount; and
a closed orientation that inhibits access to the at least one cable that is connected to the device when the device is coupled to the device bracket and the device bracket is coupled to the support surface mount.

6. The system of claim 5, wherein the securing latch engages the securing door in the secured orientation to prevent movement of the securing door from the closed orientation to the open orientation in order to prevent access to the at least one cable that is connected to the device when the device is coupled to the device bracket and the device bracket is coupled to the support surface mount.

7. An Information Handling System (IHS), comprising:
a compute module including:
a processing system; and
a member system that is coupled to the processing system and that includes instructions that, when executed by the processing system, cause the processing system to perform at least one computing operation;
a compute module bracket that is configured to couple to the compute module; and
a support surface mount that is configured to couple to the compute module bracket, wherein the support surface mount includes:
a base member that is configured to mount to a support surface;
a securing member that extends from the base member;
a securing latch that is included in the securing member and that is configured to be provided in:
a secured orientation in which the securing latch engages the compute module bracket when the compute module bracket is coupled to the support surface mount in order to secure the compute module bracket to the support surface mount; and
an unsecured orientation that allows the compute module bracket to be decoupled from the support surface mount when the compute module bracket is coupled to the support surface mount;
a release member that is configured to move the securing latch between the secured orientation and the unsecured orientation; and
a locking element that is included in the securing member and that is configured to be actuated to prevent movement of the securing latch from the secured orientation to the unsecured orientation in order to lock the compute module bracket to the support surface mount.

8. The IHS of claim 7, wherein the compute module bracket includes:
at least one first support surface mounting element that is configured to couple the compute module bracket to the support surface mount; and
at least one second support surface mounting element that is configured to engage at least one mounting post to mount the compute module bracket to a support surface without using the support surface mount.

9. The IHS of claim 8, wherein at least one second support surface mounting element includes:
a mounting feedback mechanism that is configured to provide feedback when the at least one second support surface mounting element engages the at least one mounting post to mount the compute module bracket to the support surface without using the support surface mount.

10. The IHS of claim 7, wherein the support surface mount includes:
at least one cable routing subsystem that is included on the securing member and that is configured to engage at least one cable that is connected to the compute module when the compute module is coupled to the compute module bracket and the compute module bracket is coupled to the support surface mount.

11. The IHS of claim 7, wherein the support surface mount includes:
a securing door that is configured to be provided in:
an open orientation that allows access to at least one cable that is connected to the compute module when the compute module is coupled to the compute module bracket and the compute module bracket is coupled to the support surface mount; and
a closed orientation that inhibits access to the at least one cable that is connected to the compute module when the compute module is coupled to the compute module bracket and the compute module bracket is coupled to the support surface mount.

12. The IHS of claim 11, wherein the securing latch engages the securing door in the secured orientation to prevent movement of the securing door from the closed orientation to the open orientation in order to prevent access to the at least one cable that is connected to the compute module when the compute module is coupled to the compute module bracket and the compute module bracket is coupled to the support surface mount.

13. The IHS of claim 7, wherein the locking element is configured to be actuated via engagement with a locking device when the locking device is connected to the securing member.

14. A method for mounting a device, comprising:
coupling, by a device bracket that is coupled to a device, to a support surface mount that is mounted to a support surface, wherein the support surface mount includes:
a base member that mounts the support surface mount to the support surface; and
a securing member that extends from the base member;
engaging, by the device bracket during the coupling of the device bracket to the support surface mount, a securing latch that is included in the securing member in order to move the securing latch into a secured orientation in which the securing latch engages the device bracket in order to secure the device bracket to the support surface mount;
preventing, in response to the actuation of a locking element that is included in the securing member, movement of the securing latch from the secured orientation to an unsecured orientation in order to lock the device bracket to the support surface mount;
allowing, in response to the actuation of the locking element that is included in the securing member subsequent to locking the device bracket to the support surface mount, movement of the securing latch from the secured orientation to the unsecured orientation in order to unlock the device bracket to the support surface mount;

moving, in response to actuation of a release member that is included in the securing member, the securing latch from the secured orientation to the unsecured orientation; and decoupling, by the device bracket that is coupled to the device following the movement of the securing latch from the secured orientation to the unsecured orientation, from the support surface mount that is mounted to the support surface.

15. The method of claim 14, further comprising:

engaging, by at least one first support surface mounting element that is included on the device bracket, with the support surface mount to couple the device bracket to the support surface mount; and engaging, by at least one second support surface mounting element that is included on the device bracket subsequent to decoupling the device bracket from the support surface mount, at least one mounting post to mount the device bracket to a support surface without using the support surface mount.

16. The method of claim 15, further comprising:

providing, by a mounting feedback mechanism that is included on the device bracket, feedback when the at least one second support surface mounting element engages the at least one mounting post to mount the device bracket to the support surface without using the support surface mount.

17. The method of claim 14, further comprising:

engaging, by at least one cable routing subsystem that is included on the securing member, at least one cable that is connected to a device when the device is coupled to the device bracket and the device bracket is coupled to the support surface mount.

18. The method of claim 14, further comprising:

moving, by a securing door that is included on the securing member, into an open orientation that allows access to at least one cable that is connected to the device when the device is coupled to the device bracket and the device bracket is coupled to the support surface mount; and moving, by the securing door that is included on the securing member, into a closed orientation that inhibits access to the at least one cable that is connected to the device when the device is coupled to the device bracket and the device bracket is coupled to the support surface mount.

19. The method of claim 18, further comprising:

engaging, by the securing latch, the securing door in the secured orientation to prevent movement of the securing door from the closed orientation to the open orientation in order to prevent access to the at least one cable that is connected to the device when the device is coupled to the device bracket and the device bracket is coupled to the support surface mount.

20. The method of claim 14, further comprising:

connecting, by a locking device, to the securing member in order to actuate the locking element.

* * * * *